US012660236B2

(12) United States Patent
Hsu et al.

(10) Patent No.: US 12,660,236 B2
(45) Date of Patent: Jun. 16, 2026

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Shao-Hua Hsu, Taitung City (TW);
Chih-Wei Wu, Hsinchu (TW);
Mao-Lin Weng, Taoyuan City (TW);
Wei-Yeh Tang, Taoyuan County (TW);
Yen-Cheng Lai, Tainan City (TW);
Chun-Chan Hsiao, Hsinchu City (TW);
Po-Hsiang Chuang, Taipei City (TW);
Chih-Long Chiang, Hsinchu County
(TW); Yih-Ann Lin, Hsinchu (TW);
Ryan Chia-Jen Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 763 days.

(21) Appl. No.: 17/816,742

(22) Filed: Aug. 2, 2022

(65) Prior Publication Data

US 2024/0047581 A1    Feb. 8, 2024

(51) Int. Cl.
*H10D 30/62*      (2025.01)
*H10D 30/01*      (2025.01)
*H10D 64/01*      (2025.01)

(52) U.S. Cl.
CPC ....... *H10D 30/6211* (2025.01); *H10D 30/024* (2025.01); *H10D 64/017* (2025.01); *H10D 64/021* (2025.01)

(58) Field of Classification Search
CPC .. H10D 64/017; H10D 64/517; H10D 64/518; H10D 64/018; H10D 64/021; H10D 64/015; H10D 84/0147; H10D 84/0184; H10D 84/0193; H10D 84/0142; H10D 84/0172; H10D 84/0179; H10D 30/6211; H10D 30/024; H10D 30/62
See application file for complete search history.

(56) References Cited

U.S. PATENT DOCUMENTS

| | | | | | |
|---|---|---|---|---|---|
| 8,481,415 | B2 * | 7/2013 | Yuan | ..................... | H10D 84/014 |
| | | | | | 438/585 |
| 8,896,030 | B2 * | 11/2014 | Mukherjee | ........... | H10D 84/038 |
| | | | | | 257/204 |
| 9,048,334 | B2 * | 6/2015 | Lim | .................. | H01L 21/28114 |
| 9,153,668 | B2 * | 10/2015 | Ching | ................. | H10D 84/038 |
| 9,306,032 | B2 * | 4/2016 | Lin | .................... | H01L 21/28247 |
| 9,543,399 | B2 * | 1/2017 | Hsiao | ................... | H10D 64/683 |
| 9,589,850 | B1 * | 3/2017 | Park | ................... | H10D 84/0181 |

(Continued)

*Primary Examiner* — Sophia T Nguyen
(74) *Attorney, Agent, or Firm* — WPAT LAW; Anthony King

(57) ABSTRACT

A semiconductor structure includes a semiconductor substrate, a gate electrode, a first spacer, and a first contact etch stop layer (CESL). The semiconductor substrate includes a fin structure. The gate electrode is over the fin structure. The first spacer is over the fin structure and on a lateral side of the gate electrode, wherein a top surface of the first spacer is inclined towards the gate electrode. The first CESL is over the fin structure and contacting the first spacer, wherein an angle between the top surface of the first spacer and a sidewall of the first CESL is less than about 140°.

20 Claims, 18 Drawing Sheets

(56) References Cited

U.S. PATENT DOCUMENTS

| | | | | |
|---|---|---|---|---|
| 9,716,161 B2* | 7/2017 | Cheng | H01L 21/28114 | |
| 9,824,920 B2* | 11/2017 | Park | H01L 21/76805 | |
| 9,997,633 B2* | 6/2018 | Hsiao | H10D 64/017 | |
| 10,043,879 B1* | 8/2018 | Kim | H10D 62/151 | |
| 10,262,870 B2* | 4/2019 | Chen | H10D 64/518 | |
| 10,522,682 B2* | 12/2019 | Yoon | H10D 30/6219 | |
| 10,957,779 B2* | 3/2021 | Lo | H01L 21/28088 | |
| 11,398,384 B2* | 7/2022 | Peng | H10D 64/017 | |
| 11,824,103 B2* | 11/2023 | Pan | H10D 84/038 | |
| 2011/0127589 A1* | 6/2011 | Chen | H10D 64/517 | |
| | | | 257/E21.409 | |
| 2011/0298017 A1* | 12/2011 | Jain | H01L 21/76897 | |
| | | | 257/288 | |
| 2014/0008720 A1* | 1/2014 | Xie | H10D 84/856 | |
| | | | 438/587 | |
| 2014/0374805 A1* | 12/2014 | Wu | H10D 84/0177 | |
| | | | 257/288 | |
| 2015/0118835 A1* | 4/2015 | Lin | H10D 64/017 | |
| | | | 438/586 | |
| 2015/0187946 A1* | 7/2015 | Park | H10D 64/518 | |
| | | | 257/288 | |
| 2015/0206963 A1* | 7/2015 | Ho | H10D 64/017 | |
| | | | 257/411 | |
| 2016/0005658 A1* | 1/2016 | Lin | H10D 84/0142 | |
| | | | 438/591 | |
| 2016/0064378 A1* | 3/2016 | Kwon | H10D 84/83 | |
| | | | 257/401 | |
| 2016/0104704 A1* | 4/2016 | Fang | H10D 84/038 | |
| | | | 438/275 | |
| 2016/0240630 A1* | 8/2016 | Seong | H10D 84/014 | |
| 2016/0293493 A1* | 10/2016 | Fan | H10D 64/018 | |
| 2017/0033105 A1* | 2/2017 | Wang | H01L 21/31105 | |
| 2017/0194209 A1* | 7/2017 | Li | H10D 84/0142 | |
| 2017/0213905 A1* | 7/2017 | Lee | H10D 30/6219 | |
| 2017/0222014 A1* | 8/2017 | Tak | H01L 21/76843 | |
| 2018/0061831 A1* | 3/2018 | Chang | H10D 84/83 | |
| 2018/0138188 A1* | 5/2018 | Kim | H10B 41/35 | |
| 2018/0315830 A1* | 11/2018 | Hsieh | H10D 30/62 | |
| 2019/0035676 A1* | 1/2019 | Yang | H10D 30/021 | |
| 2019/0081150 A1* | 3/2019 | Liou | H10D 64/66 | |
| 2019/0131171 A1* | 5/2019 | Gwak | H10D 64/021 | |
| 2019/0157410 A1* | 5/2019 | Yim | H10D 64/518 | |
| 2019/0165121 A1* | 5/2019 | Park | H10D 30/6211 | |
| 2019/0237541 A1* | 8/2019 | Chang | H10D 30/63 | |
| 2019/0288084 A1* | 9/2019 | Wang | H10D 30/024 | |
| 2020/0020688 A1* | 1/2020 | Badaroglu | H10D 30/6735 | |
| 2020/0027979 A1* | 1/2020 | Zang | H10D 84/038 | |
| 2020/0066719 A1* | 2/2020 | Chang | H10D 64/666 | |
| 2020/0066879 A1* | 2/2020 | Zang | H10D 30/751 | |
| 2020/0135591 A1* | 4/2020 | Yeong | H01L 21/7682 | |
| 2020/0168720 A1* | 5/2020 | Kwak | H10D 84/038 | |
| 2021/0035857 A1* | 2/2021 | Zhou | H01L 21/76224 | |
| 2021/0057581 A1* | 2/2021 | Lin | H10D 30/024 | |
| 2021/0104612 A1* | 4/2021 | Bae | H10D 30/6219 | |
| 2021/0119015 A1* | 4/2021 | Wu | H01L 21/26586 | |
| 2021/0234021 A1* | 7/2021 | Kuo | H10D 64/518 | |
| 2021/0257481 A1* | 8/2021 | Hsiao | H10D 84/038 | |
| 2021/0384192 A1* | 12/2021 | Bae | H10D 30/6735 | |
| 2021/0391464 A1* | 12/2021 | Bae | H10D 30/43 | |
| 2021/0408254 A1* | 12/2021 | Kim | H10D 84/83 | |
| 2022/0085011 A1* | 3/2022 | Lee | H01L 21/76883 | |
| 2022/0102359 A1* | 3/2022 | Su | H10D 64/018 | |
| 2022/0157653 A1* | 5/2022 | Liao | H10D 84/0158 | |
| 2022/0216300 A1* | 7/2022 | Lin | H01L 21/76832 | |
| 2022/0254881 A1* | 8/2022 | Park | H10D 64/021 | |
| 2022/0271123 A1* | 8/2022 | Lee | H10D 30/43 | |
| 2022/0302310 A1* | 9/2022 | Choi | H10D 30/6757 | |
| 2022/0310805 A1* | 9/2022 | Chun | H10D 30/43 | |
| 2022/0399452 A1* | 12/2022 | Park | H10D 84/0135 | |
| 2023/0005910 A1* | 1/2023 | Park | H10D 84/0167 | |
| 2023/0031546 A1* | 2/2023 | Park | H10D 30/43 | |
| 2023/0072817 A1* | 3/2023 | Chun | H10D 30/43 | |
| 2023/0116172 A1* | 4/2023 | Park | H10D 30/43 | |
| | | | 257/351 | |
| 2023/0131215 A1* | 4/2023 | Cho | H10D 30/6735 | |
| | | | 438/478 | |
| 2023/0178476 A1* | 6/2023 | Kang | H01L 21/76805 | |
| | | | 438/275 | |
| 2023/0187358 A1* | 6/2023 | Jung | H10D 84/834 | |
| | | | 257/369 | |
| 2023/0187535 A1* | 6/2023 | Peng | H10D 64/015 | |
| | | | 257/288 | |
| 2023/0253449 A1* | 8/2023 | Shin | H10D 30/014 | |
| | | | 257/401 | |
| 2023/0290818 A1* | 9/2023 | Kim | H10D 62/115 | |
| 2023/0317617 A1* | 10/2023 | Guler | H01L 21/76831 | |
| | | | 257/774 | |
| 2023/0361199 A1* | 11/2023 | Chen | H10D 30/014 | |
| 2024/0047581 A1* | 2/2024 | Hsu | H10D 30/024 | |
| 2024/0282834 A1* | 8/2024 | Kim | H10D 64/517 | |

* cited by examiner

SEMICONDUCTOR STRUCTURE AND METHOD FOR FORMING THE SAME

BACKGROUND

One of the challenges as device scale shrinking in semiconductor devices (e.g., FinFETs) is the conformity of metal deposition in a contact structure having a relatively high aspect ratio. The difficulty increases as the critical dimension of the contact structure reduces. For example, voids may be easily formed within the contact structure during a metal filling process. Such voids may lead to defects and may adversely affect the yield of the semiconductor devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
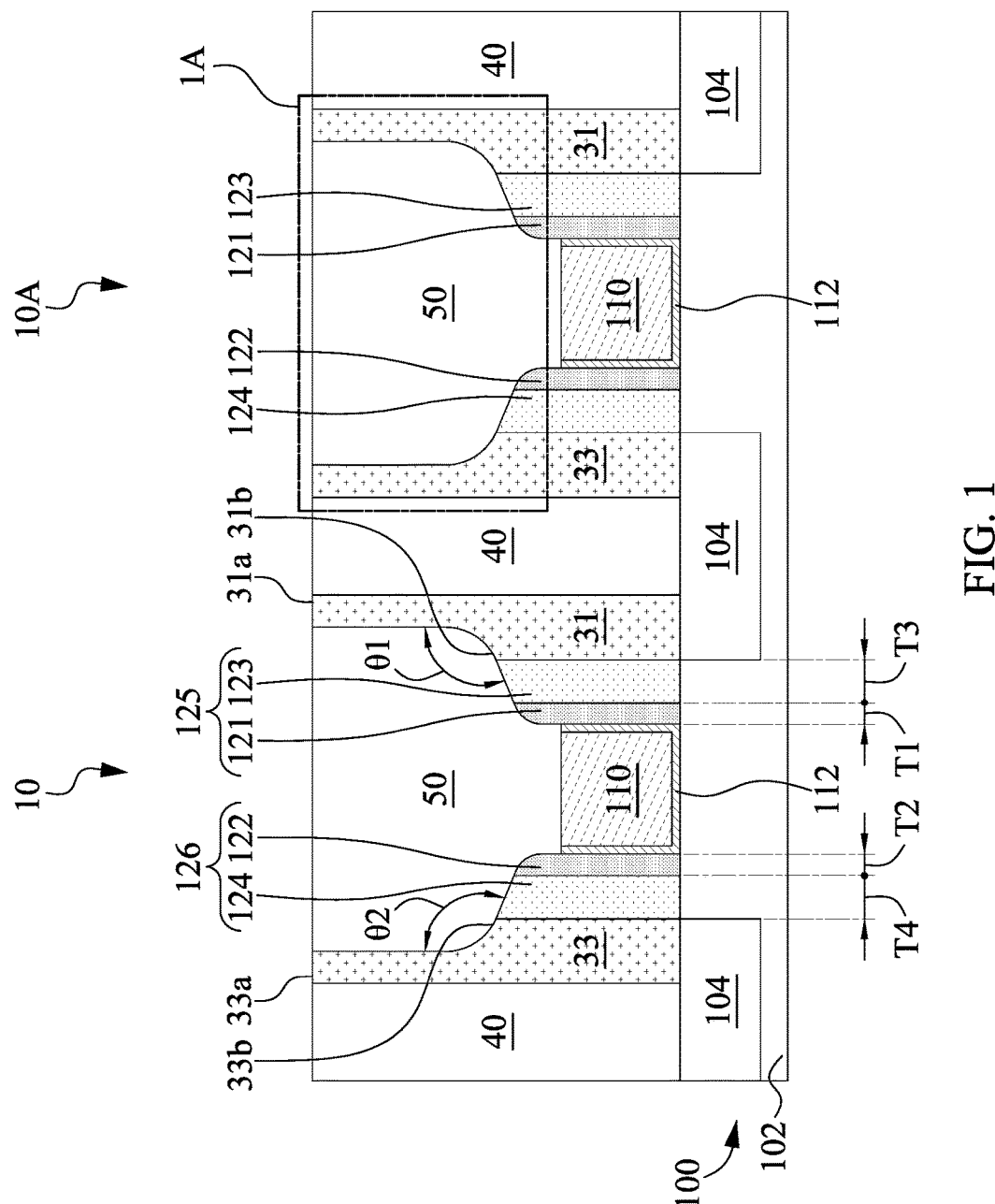
FIG. 1 is a cross-sectional view illustrating a semiconductor structure according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embodiments of the present disclosure discuss a method for forming a semiconductor structure including performing an etching process on spacers having a relatively low etching selectivity to the etching process. With the design of the relatively low etching selectivity of the spacer layers that are predetermined to define a trench for forming a gate electrode therein, a trench having a funnel-like profile with a relatively wide opening can be formed, and thus the processing window for filling a gate layer in the trench is enlarged, which is advantageous to forming the gate layer in the trench without having voids formed within the gate layer. Therefore, etchants in the etching process (i.e., the etch back process) for forming the gate electrode can be prevented from reaching or damaging the fin structure under the gate layer, and thus the yield of the semiconductor structure can be increased.

Figure 1A:
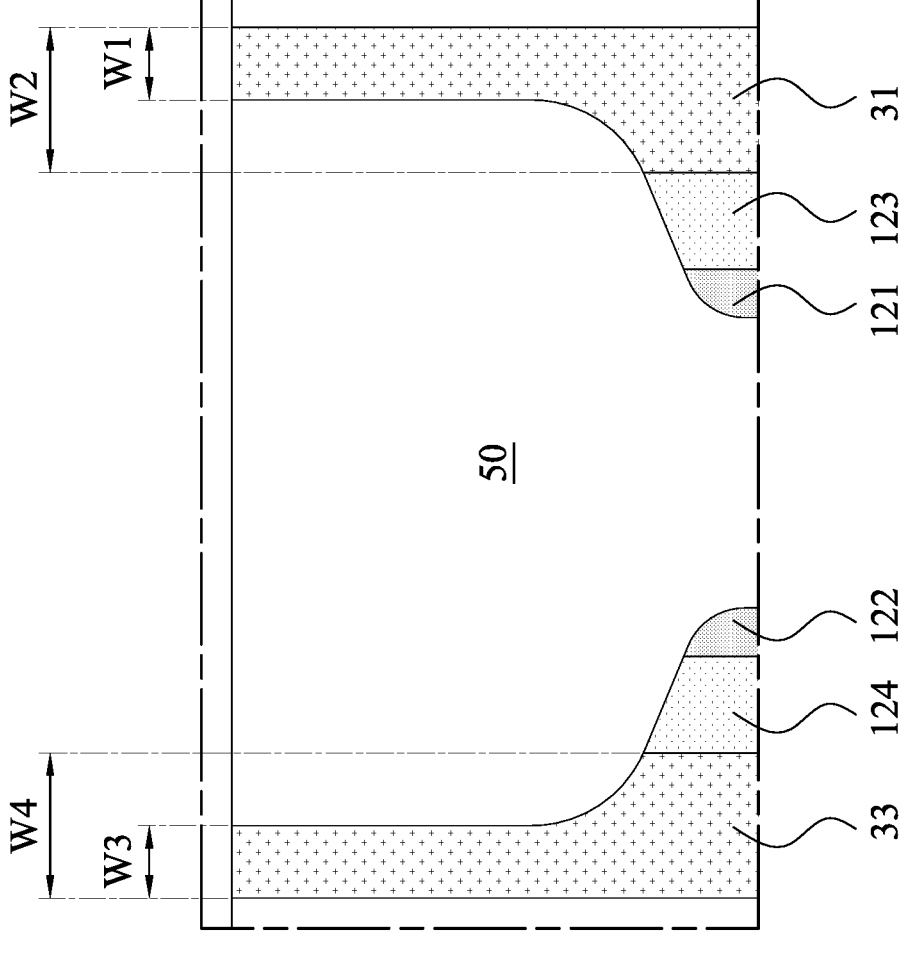
FIG. 1A is a cross-sectional view illustrating a portion of a semiconductor structure according to aspects of the present disclosure in one or more embodiments.

FIG. 1 is a cross-sectional view illustrating a semiconductor structure 1 according to aspects of the present disclosure in one or more embodiments, and FIG. 1A is a cross-sectional view illustrating a portion 1A of the semiconductor structure 1 according to aspects of the present disclosure in one or more embodiments.

Referring to FIG. 1, the semiconductor structure 1 includes a semiconductor substrate 100, gate structures 10 and 10A, contact etch stop layers (CESLs) 31 and 33, contact structures and a dielectric cap 50.

The semiconductor substrate 100 may include silicon, germanium, silicon germanium, silicon carbon, III-V compound semiconductor materials, or other proper semiconductor materials. The semiconductor substrate 100 may be a bulk substrate or constructed as a semiconductor on an insulator (SOI) substrate. In some embodiments, the semiconductor substrate 100 includes a fin structure 102 and source/drain regions 104. The source/drain region(s) hereinafter may refer to a source or a drain, individually or collectively dependent upon the context. The source/drain regions 104 may be doped features or epitaxial layers including Ge, Si, GaAs, AlGaAs, SiGe, GaAsP, SiP, or other suitable material. The source/drain regions 104 may be further doped with boron, carbon, phosphorous, or other suitable material.

The gate structures 10 and 10A may be over the fin structure 102 of the semiconductor substrate 100. In some embodiments, each of the gate structures 10 and 10A includes a gate electrode 110, a gate dielectric 112, and a spacer structure including spacers 125 and 126. The spacer structure may have an inclined top surface. The top surface of the spacer structure may be a sloped surface extending downwards from the CESL to the gate electrode 110.

In some embodiments, the gate electrode 110 is over the fin structure 102 of the semiconductor substrate 100. The gate electrode 110 may include a gate metal layer or a gate stacked including multiple gate metal layers. The gate layer may include Ti, Ag, Al, TiAlN, TaC, TaCN, TaSiN, Mn, Zr, TiN, TaN, Ru, Mo, Al, WN, Cu, W, Re, Jr, Co, Ni, other suitable metal materials or a combination thereof.

In some embodiments, the gate dielectric 112 is between the gate electrode 110 and the fin structure 102 of the semiconductor substrate 100. The gate dielectric 112 may include one or more high-k dielectric materials having a high dielectric constant, for example, greater than that of thermal silicon oxide (about 3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide, strontium titanate, hafnium oxynitride ($HfO_xN_y$), other suitable metal oxides, or combinations thereof.

In some embodiments, the spacer 125 and the spacer 126 are over the fin structure 102 of the semiconductor substrate 100. In some embodiments, the spacer 125 and the spacer 126 are on opposite lateral sides of the gate electrode 110. In some embodiments, the top surface of the spacer 125 is inclined towards the gate electrode 110, and the top surface of the spacer 126 is inclined towards the gate electrode 110.

In some embodiments, the spacer 125 includes a sub-spacer 121 proximal to the gate electrode 110 and a sub-spacer 123 distal from the gate electrode 110. In some embodiments, the top surface of the sub-spacer 121 is inclined towards the gate electrode 110, and the top surface of the sub-spacer 123 is inclined towards the gate electrode 110. In some embodiments, a thickness T1 of the sub-spacer 121 is less than a thickness T3 of the sub-spacer 123. In some embodiments, a ratio (T1/T3) of the thickness T1 of the sub-spacer 121 to the thickness T3 of the sub-pacer 123 is less than about 0.8, about 0.6, about 0.4, about 0.3, or about 0.2. In some embodiments, the sub-spacer 121 and the sub-spacer 123 may independently include one or more low-k dielectric materials such as silicon nitride, silicon oxide, silicon carbide, silicon oxycarbide (SiOC), silicon oxycarbon nitride (SiOCN), other suitable materials, or a combination thereof. In some embodiments, the sub-spacer 123 has a greater thickness and a lower k value compared to that of the sub-spacer 121. In some embodiments, the sub-spacer 121 has a higher etching resistance than the sub-spacer 123. In some embodiments, the sub-spacer 121 is formed of $SiO_xC_yN_z$ that is nitrogen-rich, for example, z may be equal to or greater than x, and z may be greater than y. In some embodiments, the sub-spacer 123 is formed of $SiO_xC_yN_z$ that is oxygen-rich, for example, x may be greater than y and z.

In some embodiments, the spacer 126 includes a sub-spacer 122 proximal to the gate electrode 110 and a sub-spacer 124 distal from the gate electrode 110. In some embodiments, the top surface of the sub-spacer 122 is inclined towards the gate electrode 110, and the top surface of the sub-spacer 124 is inclined towards the gate electrode 110. In some embodiments, a thickness T2 of the sub-spacer 122 is less than a thickness T4 of the sub-spacer 124. In some embodiments, a ratio (T2/T4) of the thickness T2 of the sub-spacer 122 to the thickness T4 of the sub-pacer 124 is less than about 0.8, about 0.6, about 0.4, about 0.3, or about 0.2. In some embodiments, the thickness T2 of the sub-spacer 122 may be substantially the same as or different from the thickness T1 of the sub-spacer 121. In some embodiments, the thickness T4 of the sub-spacer 124 may be substantially the same as or different from the thickness T3 of the sub-spacer 123. In some embodiments, the sub-spacer 122 and the sub-spacer 124 may independently include one or more low-k dielectric materials such as silicon nitride, silicon oxide, silicon carbide, silicon oxycarbide (SiOC), silicon oxycarbon nitride (SiOCN), other suitable materials, or a combination thereof. In some embodiments, the sub-spacer 124 has a greater thickness and a lower k value compared to that of the sub-spacer 122. In some embodiments, the sub-spacer 122 has a higher etching resistance than the sub-spacer 124. In some embodiments, the sub-spacer 122 is formed of $SiO_xC_yN_z$ that is nitrogen-rich, for example, z may be equal to or greater than x, and z may be greater than y. In some embodiments, the sub-spacer 124 is formed of $SiO_xC_yN_z$ that is oxygen-rich, for example, x may be greater than y and z.

In some embodiments, the CESL 31 is over the fin structure 102 of the semiconductor substrate 100. In some embodiments, the CESL 31 is disposed on a side the spacer 125 opposite to the gate electrode 110. In some embodiments, the CESL 31 contacts the spacer 125. In some embodiments, an angle θ1 between the top surface (or an extension line of the top surface) of the spacer 125 and a sidewall of the CESL 31 is less than about 140°. In some embodiments, the angle θ1 is equal to or less than about 135°. In some embodiments, the angle θ1 is about 120° to about 135°. In some embodiments, the CESL 31 includes silicon nitride, silicon carbon nitride, silicon oxynitride, other suitable materials, or a combination thereof. In some embodiments, an etching selectivity of the spacer layers for forming the spacers 121 and 122 with respect to the spacer layers for forming the spacers 123 and 124 of the etching process is less than about 2.

In some embodiments, the CESL 31 includes a stepped structure. In some embodiments, the CESL 31 has a stepped surface 31b substantially aligned to the top surface of the spacer 125. In some embodiments, the CESL 31 has a top surface 31a at an elevation higher than an elevation of the stepped surface 31b. In some embodiments, the stepped structure of the CESL 31 includes a lower step having a width W2 and an upper step having a width W1. In some embodiments, a ratio (W1/W2) of the width W1 of the upper step to the width W2 of the lower step is less than about 0.8, about 0.7, about 0.6, about 0.5, or about 0.4. In some embodiments, the stepped surface 31b of the CESL 31 may inclined towards the spacer 125.

In some embodiments, the CESL 33 is over the fin structure 102 of the semiconductor substrate 100. In some embodiments, the CESL 33 is disposed on a side the spacer 126 opposite to the gate electrode 110. In some embodiments, the CESL 33 contacts the spacer 126. In some embodiments, an angle θ2 between the top surface (or an extension line of the top surface) of the spacer 126 and a sidewall of the CESL 33 is less than about 140°. In some embodiments, the angle θ2 is equal to or less than about 135°. In some embodiments, the angle θ2 is about 120° to about 135°. In some embodiments, the CESL 33 includes silicon nitride, silicon carbon nitride, silicon oxynitride, other suitable materials, or a combination thereof. In some embodiments, the angle θ2 may be the substantially same as or different from the angle θ1.

In some embodiments, the CESL 33 includes a stepped structure. In some embodiments, the CESL 33 has a stepped surface 33b substantially aligned to the top surface of the spacer 126. In some embodiments, the CESL 33 has a top surface 33a at an elevation higher than an elevation of the stepped surface 33b. In some embodiments, the stepped structure of the CESL 33 includes a lower step having a width W4 and an upper step having a width W3. In some embodiments, a ratio (W3/W4) of the width W3 of the upper step to the width W4 of the lower step is less than about 0.8, about 0.7, about 0.6, about 0.5, or about 0.4. In some embodiments, the stepped surface 33b of the CESL 33 may inclined towards the spacer 126.

In some embodiments, the contact structures 40 are over the fin structure 102 of the semiconductor substrate 100. In some embodiments, the contact structure 40 contacts the CESL 31. In some embodiments, each of the contact structures 40 is electrically connected to a corresponding source/drain region 104. In some embodiments, the contact structure 40 includes copper, copper alloys, aluminum, tungsten, or other proper conductor materials.

In some embodiments, the dielectric cap 50 is over the gate electrode 110. In some embodiments, the dielectric cap 50 is on the gate electrode 110 serving as a protection layer. In some embodiments, the dielectric cap 50 contacts the CESLs 31 and 33. In some embodiments, the dielectric cap 50 contacts the spacers 125 and 126. In some embodiments, the dielectric cap 50 may include $SiO_2$, silicon nitride, a high-K dielectric material, or other suitable material.

In some embodiments, the structural details of the gate structure 10A are similar to those of the gate structure 10, and the description is omitted hereinafter.

Figure 2:
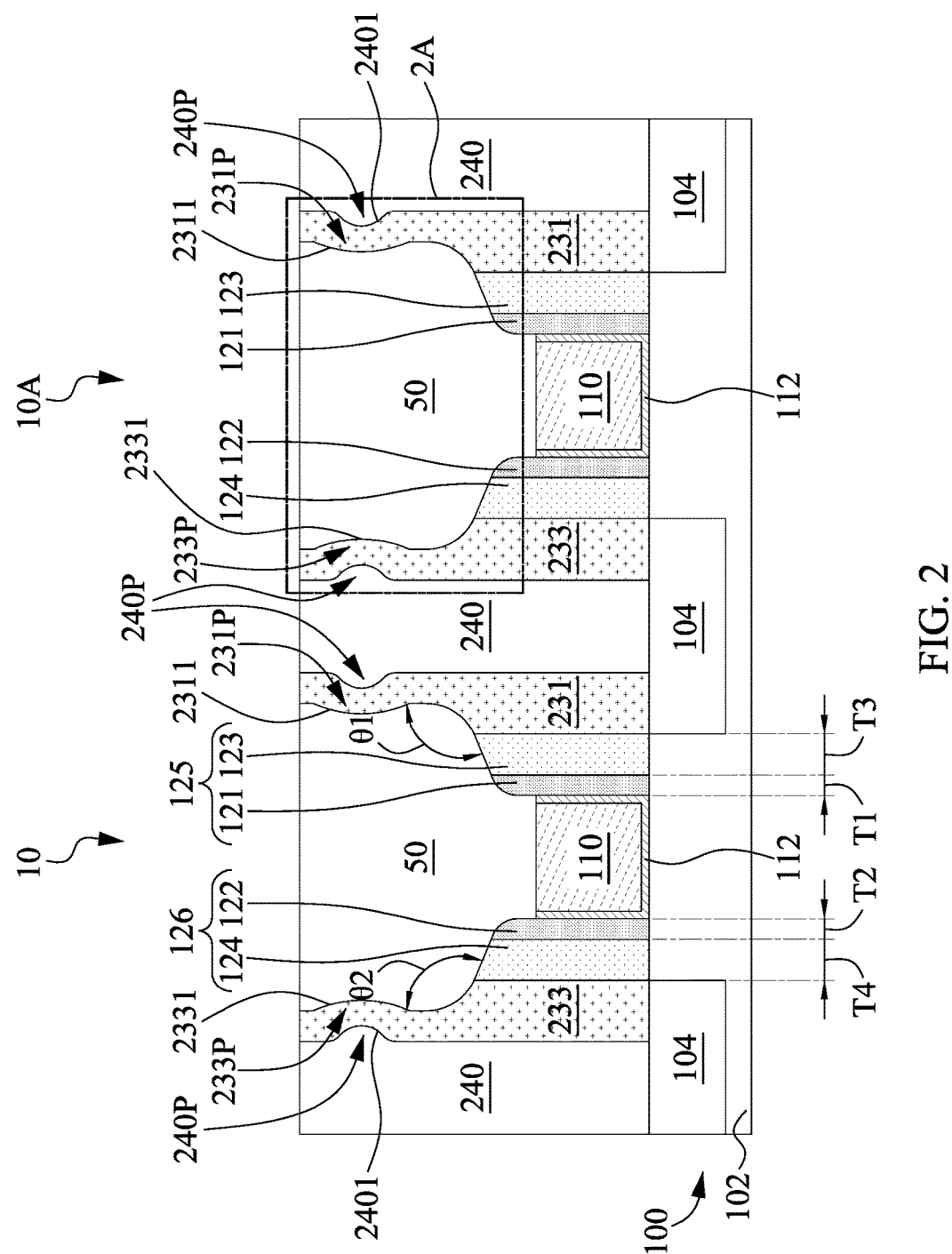
FIG. 2 is a cross-sectional view illustrating a semiconductor structure according to aspects of the present disclosure in one or more embodiments.
Figure 2A:
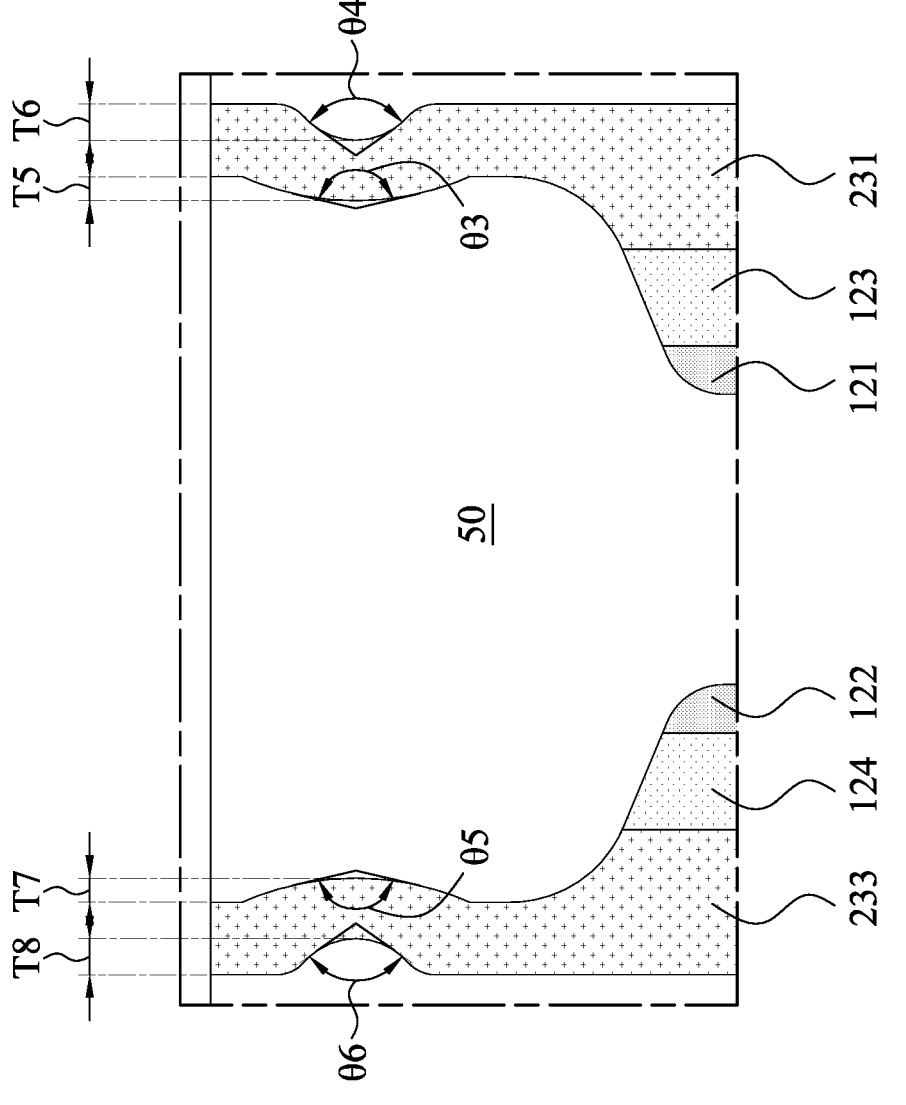
FIG. 2A is a cross-sectional view illustrating a portion of a semiconductor structure according to aspects of the present disclosure in one or more embodiments.

FIG. 2 is a cross-sectional view illustrating a semiconductor structure 2 according to aspects of the present disclosure in one or more embodiments, and FIG. 2A is a cross-sectional view illustrating a portion 2A of the semiconductor structure 2 according to aspects of the present disclosure in one or more embodiments. In some embodiments, the semiconductor structure 2 is similar to the semiconductor structure 1 in FIG. 1, with differences therebetween as follows. Descriptions of similar components are omitted.

In some embodiments, the CESL 231 includes a hump 231P (also referred to as "a protrusion") protruding towards the dielectric cap 50. In some embodiments, the hump 231P has a curved surface 2311. In some embodiments, an interface between the dielectric cap 50 and the CESL 231 includes a curved portion (i.e., the curved surface 2311 of the hump 231P). In some embodiments, the hump 231P is protruded from a sidewall of the CESL 231 and has a thickness T5. A hump angle θ3 may be defined by extension lines starting from bottom edges of the hump 231P. In some embodiments, the hump angle θ3 is equal to or greater than about 170°. In some embodiments, the hump angle θ3 is from about 170° to less than about 180°, for example, from about 170° to about 179°, from about 170° to about 177°, or from about 173° to about 175°.

In some embodiments, the contact structure 240 includes a hump 240P (also referred to as "a protrusion") protruding towards the CESL 231. In some embodiments, the hump 240P has a curved surface 2401 contacting the CESL 231. In some embodiments, an interface between the contact structure 240 and the CESL 231 includes a curved portion (i.e., the curved surface 2401 of the hump 240P that contacts the CESL 231). In some embodiments, the hump 240P is protruded from a sidewall of the contact structure 240 towards the CESL 231 and has a thickness T6. A hump angle θ4 may be defined by extension lines starting from bottom edges of the hump 240P that protrudes towards the CESL 231. In some embodiments, the hump angle θ4 is less than about 170°. In some embodiments, the hump angle θ4 is from about 160° to less than about 170°, for example, from about 160° to about 169°, from about 162° to about 168°, or from about 163° to about 167°.

In some embodiments, the thickness T5 of the hump 231P is less than the thickness T6 of the hump 240P that contacts the CESL 231. In some embodiments, a curvature of the curved surface 2311 of the hump 231P is greater than a curvature of the curved surface 2401 of the hump 240P that contacts the CESL 231. In some embodiments, the hump angle θ4 is less than the hump angle θ3.

In some embodiments, the CESL 233 includes a hump 233P (also referred to as "a protrusion") protruding towards the dielectric cap 50. In some embodiments, the hump 233P has a curved surface 2331. In some embodiments, an interface between the dielectric cap 50 and the CESL 233 includes a curved portion (i.e., the curved surface 2331 of the hump 233P). In some embodiments, the hump 233P is protruded from a sidewall of the CESL 233 and has a thickness T7. A hump angle θ5 may be defined by extension lines starting from bottom edges of the hump 235P. In some embodiments, the hump angle θ5 is equal to or greater than about 170°. In some embodiments, the hump angle θ5 is from about 170° to less than about 180°, for example, from about 170° to about 179°, from about 170° to about 177°, or from about 173° to about 175°. In some embodiments, the hump angle θ5 may be substantially the same as or different from the hump angle θ3.

In some embodiments, the contact structure 240 includes a hump 240P (also referred to as "a protrusion") protruding towards the CESL 233. In some embodiments, the hump 240P has a curved surface 2401 contacting the CESL 233. In some embodiments, an interface between the contact structure 240 and the CESL 233 includes a curved portion (i.e., the curved surface 2401 of the hump 240P that contacts the CESL 233). In some embodiments, the hump 240P is protruded from a sidewall of the contact structure 240 towards the CESL 233 and has a thickness T8. A hump angle θ6 may be defined by extension lines starting from bottom edges of the hump 240P that protrudes towards the CESL 233. In some embodiments, the hump angle θ6 is less than about 170°. In some embodiments, the hump angle θ6 is from about 160° to less than about 170°, for example, from about 160° to about 169°, from about 162° to about 168°, or from about 163° to about 167°. In some embodiments, the hump angle θ6 may be substantially the same as or different from the hump angle θ4.

In some embodiments, the thickness T7 of the hump 233P is less than the thickness T8 of the hump 240P that contacts the CESL 233. In some embodiments, a curvature of the curved surface 2331 of the hump 233P is greater than a curvature of the curved surface 2401 of the hump 240P that contacts the CESL 233. In some embodiments, the hump angle θ6 is less than the hump angle θ5.

Figure 3:
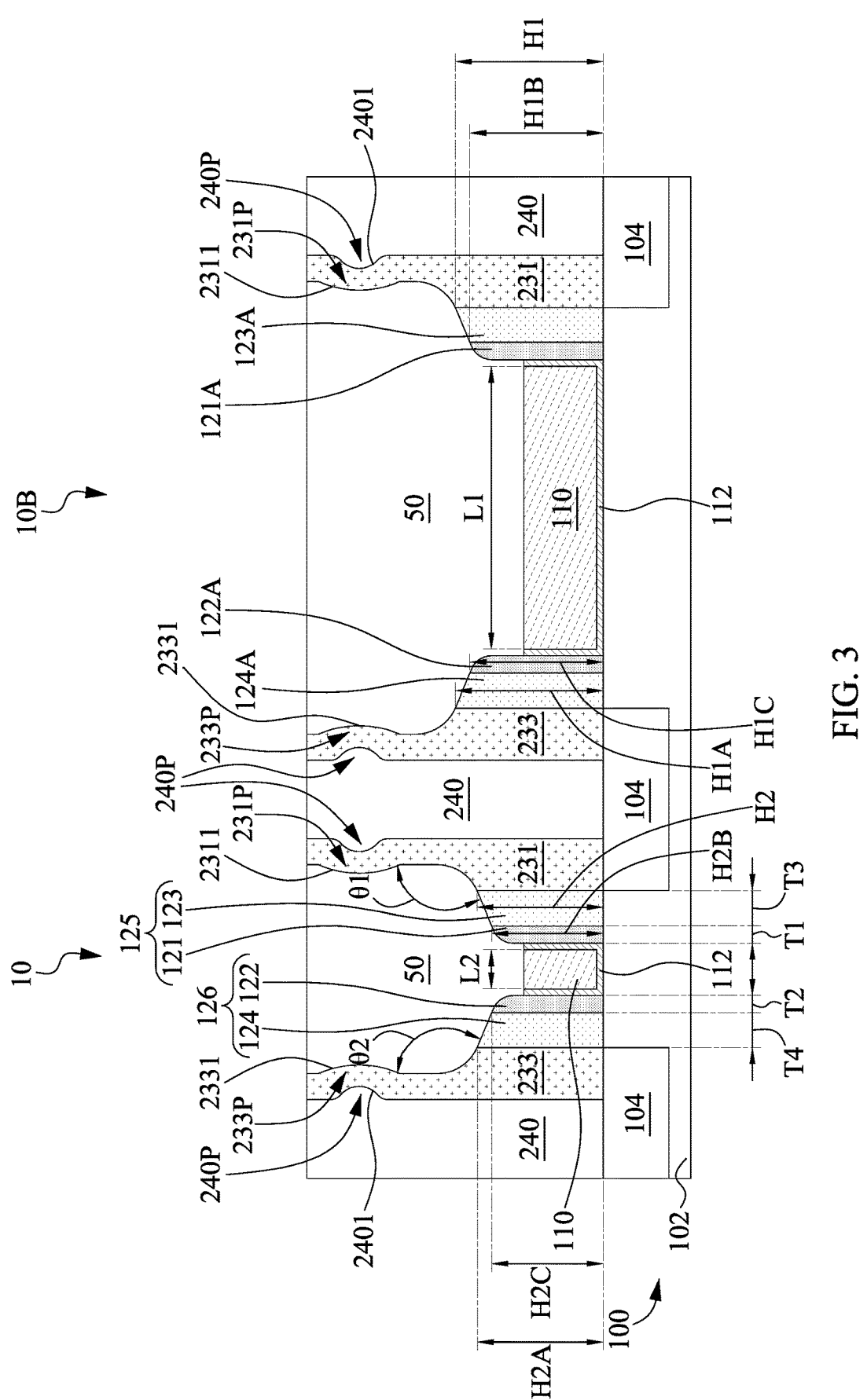
FIG. 3 is a cross-sectional view illustrating a semiconductor structure according to aspects of the present disclosure in one or more embodiments.

FIG. 3 is a cross-sectional view illustrating a semiconductor structure 3 according to aspects of the present disclosure in one or more embodiments. In some embodiments, the semiconductor structure 3 is similar to the semiconductor structure 2 in FIG. 2, with differences therebetween as follows. Descriptions of similar components are omitted.

In some embodiments, a channel length (e.g., length L1) of the gate structure 10B is greater than a channel length (e.g., length L2) of the gate structure 10. In some embodiments, a length L1 of the gate electrode 110 of the gate structure 10B is greater than a length L2 of the gate electrode 110 of the gate structure 10. In some embodiments, a ratio of (L1/L2) of the channel length (e.g., the length L1) of the gate structure 10B to the channel length (e.g., the length L2) of the gate structure 10 is greater than 1. In some embodiments, the ratio of (L1/L2) of the channel length (e.g., the length L1) of the gate structure 10B to the channel length (e.g., the length L2) of the gate structure 10 is greater than about 2, about 5, about 7, or about 8. In some embodiments, the channel length (e.g., the length L1) of the gate structure 10B is about 90 nm to about 110 nm, and the channel length (e.g., the length L2) of the gate structure 10 is about 10 nm to about 15 nm.

In some embodiments, a height of the spacer structure (e.g., including the spacers 125A and 126A) of the gate structure 10B is greater than a height of the spacer structure (e.g., including the spacers 125 and 126) of the gate structure 10. In some embodiments, a ratio of the channel length of the gate structure 10B to the channel length of the gate structure 10 is greater than about 5, about 7, or about 8, and a difference between the height of the spacer structure of the gate structure 10B and the height of the spacer structure of the gate structure 10 is from about 5 nm to about 15 nm, from about 7 nm to about 13 nm, or from about 8 nm to about 12 nm. In some embodiments, a ratio of the channel length of the gate structure 10B to the channel length of the gate structure 10 is greater than about 5, about 7, or about 8, and a ratio of a difference between the height of the spacer structure of the gate structure 10B and the height of the spacer structure of the gate structure 10 to the channel length of the gate structure 10B is from about 0.05 to about 0.15, about 0.07 to about 0.13, or about 0.09 to about 0.11.

In some embodiments, the height of the space structure of the gate structure 10B may refer to a height H1 of the spacer 123A, a height H1A of the spacer 124A, a height H1B of the spacer 121A, or a height H1C of the spacer 122A. In some embodiments, the height of the space structure of the gate structure 10 may refer to a height H2 of the spacer 123, a height H2A of the spacer 124, a height H2B of the spacer 121, or a height H2C of the spacer 122. In some embodiments, the height H1 of the spacer 123A is greater than the height H2 of the spacer 123. In some embodiments, the height H1A of the spacer 124A is greater than the height H2A of the spacer 124. In some embodiments, the height H1B of the spacer 121A is greater than the height H2B of the spacer 121. In some embodiments, the height H1C of the spacer 122A is greater than the height H2C of the spacer 122.

FIGS. 4A to 4K are cross-sectional views illustrating a semiconductor structure 1 at various fabrication stages according to aspects of the present disclosure in one or more embodiments.

Figure 4A:
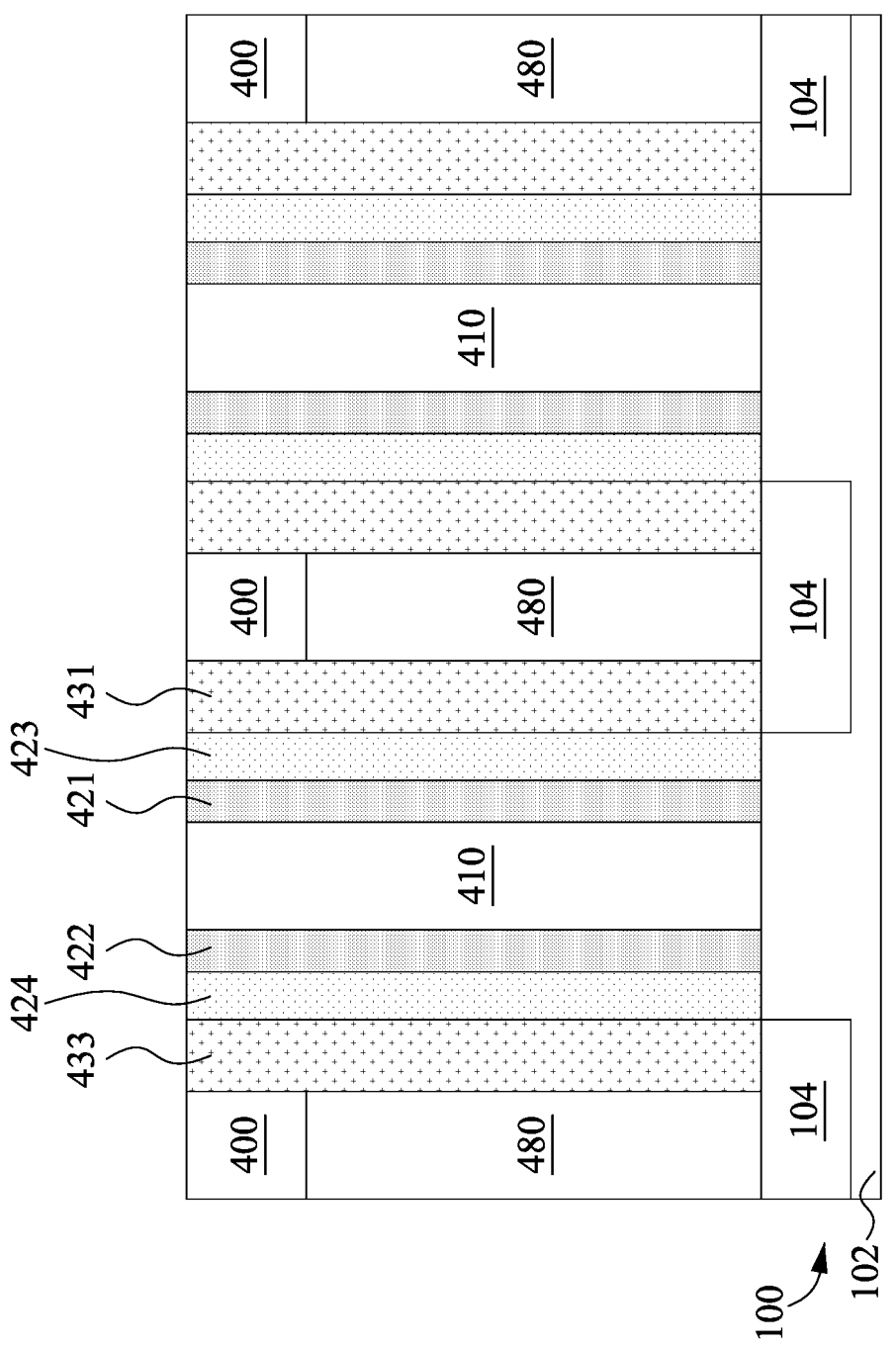
FIGS. 4A to 4K are cross-sectional views illustrating a semiconductor structure at various fabrication stages according to aspects of the present disclosure in one or more embodiments.

Referring to FIG. 4A, a dummy gate layer 410 may be formed over a fin structure 102 of a semiconductor substrate 100. A dummy gate dielectric (not shown in drawings) may be formed between the fin structure 102 and the dummy gate layer 410. In some embodiments, a pair of spacer layers 421 and 422 are formed on opposite lateral sides of the dummy gate layer 410. In some embodiments, a pair of spacer layers 423 and 424 are formed on the spacer layers 421 and 422, respectively. In some embodiments, a pair of CESLs 431 and 433 are formed on the spacer layers 423 and 424, respectively. An inter-layer dielectric (ILD) layer 480 may be formed over the semiconductor substrate 100 and on the CESLs 431 and 433. A hard mask 400 may be formed over the ILD layer 480. The hard mask 400 may include a dielectric material such as a semiconductor oxide, a semiconductor nitride, and/or a semiconductor carbide.

In some embodiments, the dummy gate layer 410 may include amorphous silicon, polycrystalline silicon (polysilicon), and/or single crystalline silicon. The dummy gate layer 410 may be formed by various process steps, such as layer deposition, patterning, etching, and other suitable processing steps. The layer deposition may include CVD, PVD, ALD or other suitable deposition processes. The patterning may include a lithography process. The etching may include a dry etching process, a wet etching process, and/or other etching methods. In some embodiments, the spacer layers 421, 422, 423, and 424 may be formed by chemical oxidation, thermal oxidation, ALD, CVD, and/or other suitable methods. In some embodiments, the CESLs 431 and 433 may be formed by ALD, PECVD, or other suitable deposition or oxidation processes. The ILD layer 480 may include one or more materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 480 may be formed by a PECVD process, a flowable CVD (FCVD) process, or other suitable deposition technique.

Figure 4B:
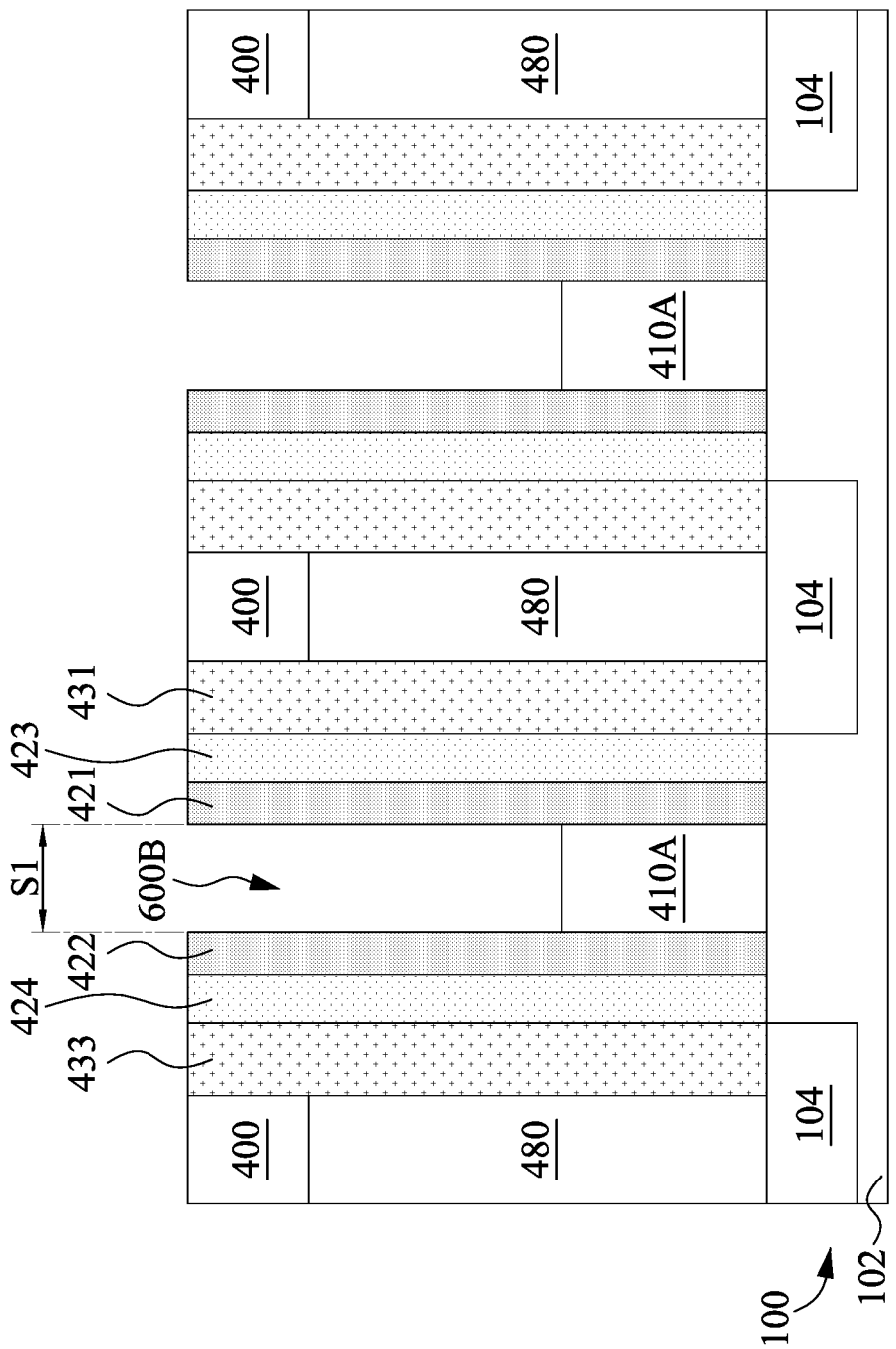

Referring to FIG. 4B, the dummy gate layer 410 may be partially removed to expose a portion of the spacer layers 421 and 422. The exposed portions of the spacer layers 421 and 422 and remained dummy gate layer 410A define a trench 600B. The trench 600B has an opening with a size S1.

Figure 4C:
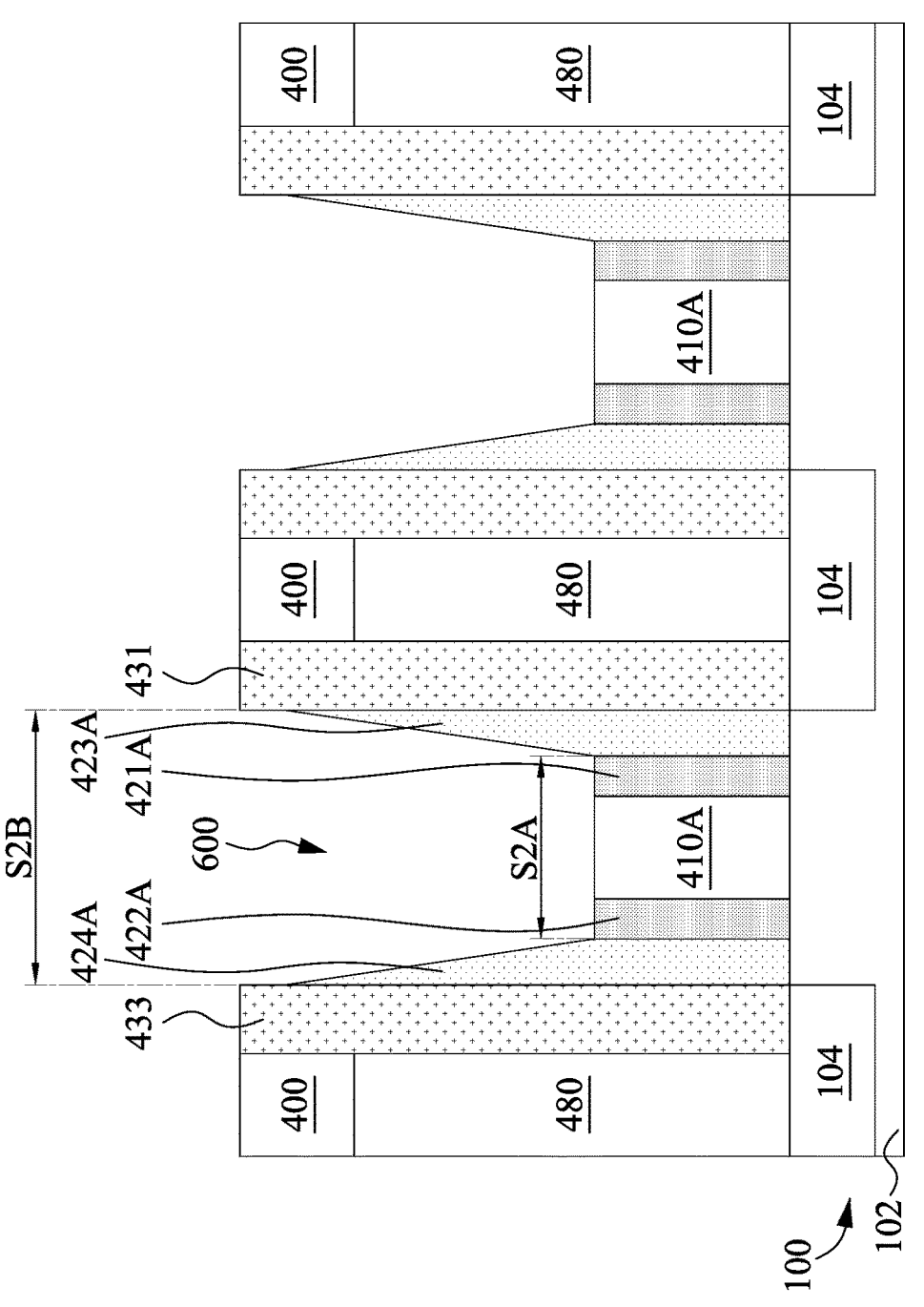

Referring to FIG. 4C, an etching process may be performed to remove the portion of the spacer layers 421 and 422 exposed by the dummy gate layer 410A and a portion of the spacer layers 423 and 424. In some embodiments, an etching selectivity of the spacer layers 421 and 422 with respect to the spacer layers 423 and 424 of the etching process is less than about 2. In some embodiments, the etching selectivity of the spacer layers 421 and 422 with respect to the spacer layers 423 and 424 of the etching process is less than about 1.8, about 1.6, about 1.4, about 1.2, or about 1.1.

In some embodiments, remained portions 421A and 422A of the spacer layers 421 and 422 are covered by the dummy gate layer 410A. In some embodiments, remained portions 423A and 424A of the spacer layers 423 and 424 are formed on sidewalls of the CESLS 431 and 433 after performing the etching process. In some embodiments, portions of the sidewalls of the CESLs 431 and 433 are exposed by the remained portions 423A and 424A. In some embodiments, the remained portions 423A and 424A of the spacer layers 423 and 424 taper away from the fin structure 102 to define a trench 600 having a size increasing toward a direction away from the fin structure 102. For example, the trench 600 may have a bottom with a size S2A and an opening with a size S2B greater than the size S2A. In some embodiments, the trench 600 has a funnel-like profile. In some embodiments, the exposed portions of the sidewalls of the CESLs 431 and 433 define the opening of the trench 600. In some embodiments, the size S2B of the opening of the trench 600 is greater than the size S1 of the opening of the trench 600B.

In some embodiments, the etching process includes a dry etching process. In some embodiments, the etching process includes a plasma etching process using a fluorine-based etchant. The etching gas may include a fluorine-based etchant including $CF_4$, $CHF_3$, $C_4F_8$, $C_4F_6$, or the like. The etching gas may further include a carrier gas including $N_2$ or Ar. The etching gas may further include assisting etchant including $O_2$, $H_2$, or the like. The desired etching selectivity may be achieved by adjusting various parameters of the etching process, such as a ratio of the components in the etching gas, power of plasma, etching time, frequency of plasma pulsing, and/or other parameters.

In some other embodiments, portions of the spacers 423 and 424 exposed from the dummy gate layer 410A may be removed, and the remained portions 423A and 424A may have top surfaces substantially aligned to top surfaces of the remained portions 421A and 422A of the spacer layers 421 and 422.

Figure 4D:
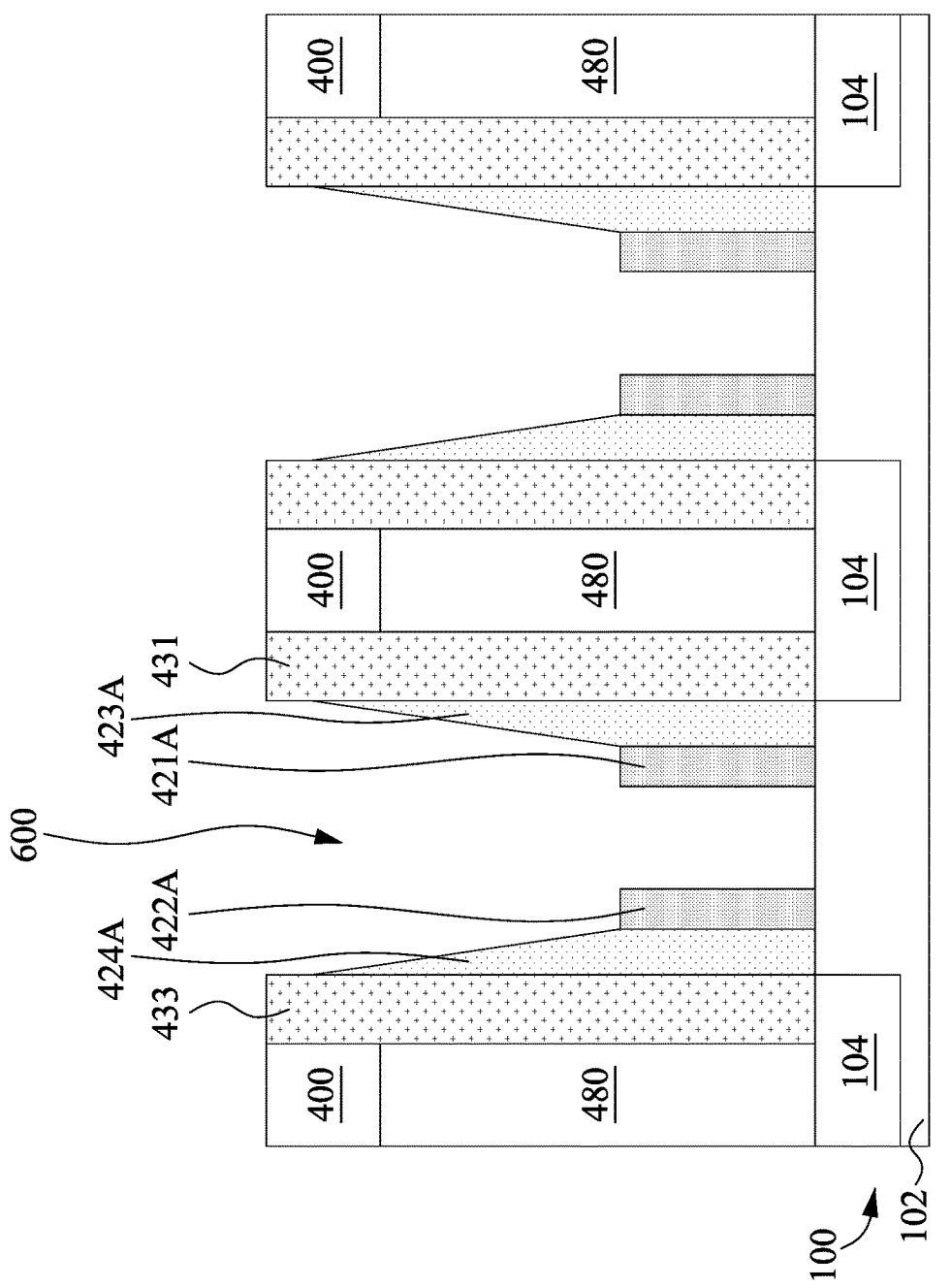

Referring to FIG. 4D, the dummy gate layer 410A may be completely removed to expose the remained portions 421A and 422A of the spacer layers 421 and 422. The dummy gate layer 410A may be completely removed by an etching process. In some embodiments, the dummy gate dielectric may be removed.

Figure 4E:
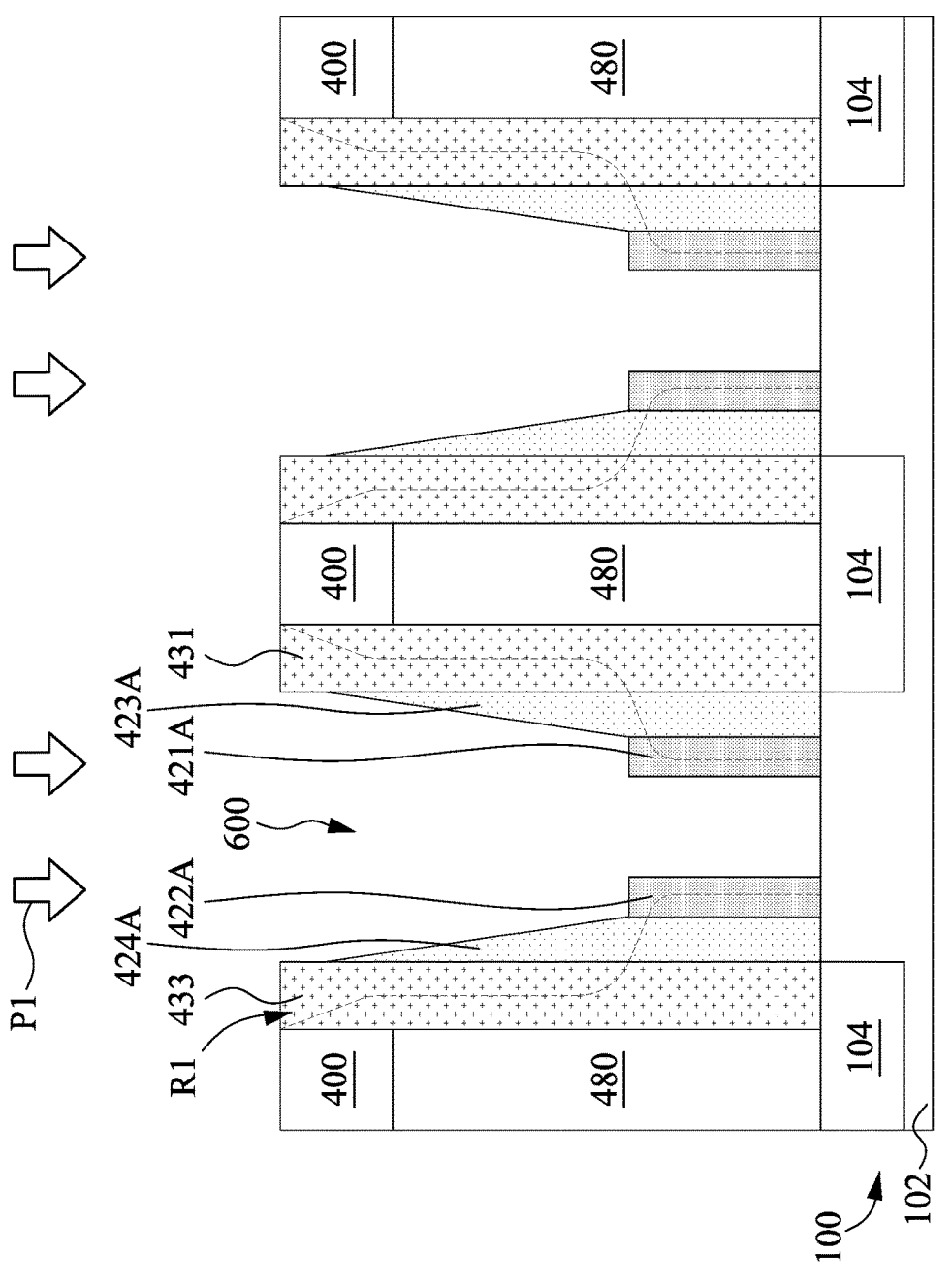

Referring to FIG. 4E, an oxidation process P1 may be performed on the remained portions 421A and 422A of the spacer layers 421 and 422 and portions of the CESLs 431 and 433 after completely removing the dummy gate layer 410A. In some embodiments, the oxidation process P1 is performed on exposed surfaces of the remained portions 421A and 422A of the spacer layers 421 and 422, the remained portions 423A and 424A of the spacer layers 423 and 424, and portions of the CESLs 431 and 433. In some embodiments, the oxidation process P1 oxidizes a region R1 of the remained portions 421A and 422A of the spacer layers 421 and 422, the remained portions 423A and 424A of the spacer layers 423 and 424, and portions of the CESLs 431 and 433 adjacent to the exposed surfaces. In some embodiments, the structures and/or the materials in the region R1 became oxide-based or oxygen-rich after the oxidation process P1. In some embodiments, the oxidation process P1 includes a plasma oxidation process. In some embodiments, oxygen gas is applied for about 1 to 3 minutes, e.g., about 2 minutes, with a plasma applied with a power of about 1100 W to 1300 W, e.g., about 1200 W.

Figure 4F:
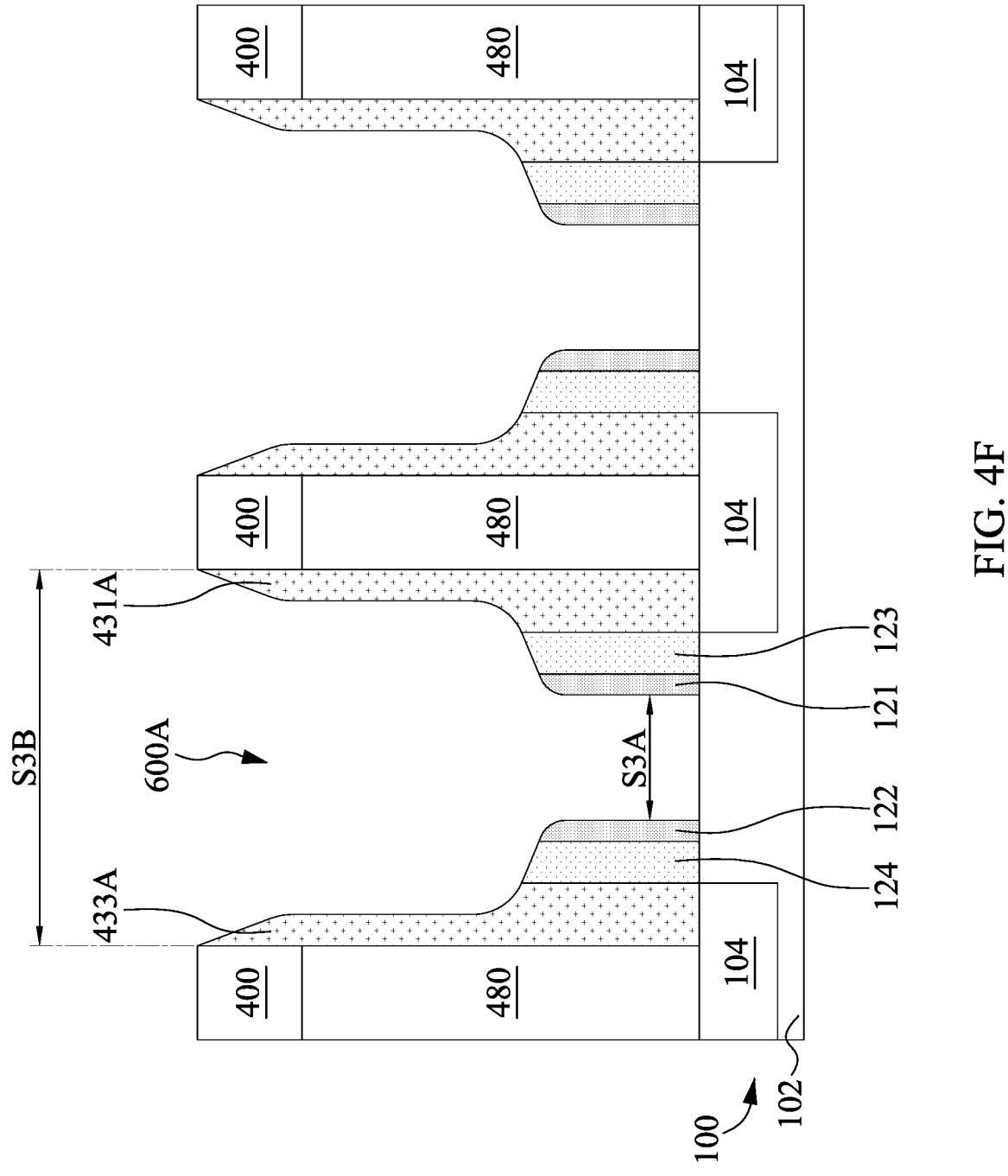

Referring to FIG. 4F, a portion of the remained portions 423A and 424A of the spacer layers 423 and 424 exposed by the remained portions 421A and 422A of the spacer layers 421 and 422 may be removed to form a pair of spacers 123 and 124. In some embodiments, the CESLs 431 and 433 are partially removed to form remained portions 431A and 433A of the CESLs 431 and 433 that taper away from the fin structure 102 to define a trench 600A having a size increasing toward a direction away from the fin structure 102. For example, the trench 600A may have a bottom with a size S3A and an opening with a size S3B greater than the size S3A. In some embodiments, the trench 600A has a funnel-like profile. In some embodiments, the remained portions 431A and 433A of the CESLs 431 and 433 define the opening of the trench 600. In some embodiments, the size S2B of the opening of the trench 600 is greater than the size S1 of the opening of the trench 600B.

In some embodiments, the remained portions 421A and 422A of the spacer layers 421 and 422 are partially removed to form a pair of spacers 121 and 122. In some embodiments, partially removing the remained portions 421A and 422A of the spacer layers 421 and 422 and partially removing the CESLs 431 and 433 are performed in a same process. In some embodiments, removing a portion of the remained portions 423A and 424A of the spacer layers 423 and 424, partially removing the remained portions 421A and 422A of the spacer layers 421 and 422, and partially removing the CESLs 431 and 433 are performed in a same process.

In some embodiments, removing a portion of the remained portions 423A and 424A of the spacer layers 423 and 424, partially removing the remained portions 421A and 422A of the spacer layers 421 and 422, and partially removing the CESLs 431 and 433 are performed by an etching process. In some embodiments, an etching selectivity of the remained portions 423A and 424A with respect to the remained portions 421A and 422A of the etching process is less than about 2. Therefore, a difference in the etched amounts of the remained portions 423A and 424A and the etched amounts of the remained portions 421A and 422A is relatively small, and thus the a difference in the height of the as-formed spacers 121 and 122 and the as-formed spacers 123 and 124 is relatively small. Therefore, referring to FIG. 1, an angle θ1 between the top surface (or an extension line of the top surface) of the spacers 121 and 123 and a sidewall of the CESL 31 is relatively small (e.g., less than about 140°), and an angle θ2 between the top surface (or an extension line of the top surface) of the spacers 122 and 124 and a sidewall of the CESL 33 is relatively small (e.g., less than about 140°).

Figure 4G:
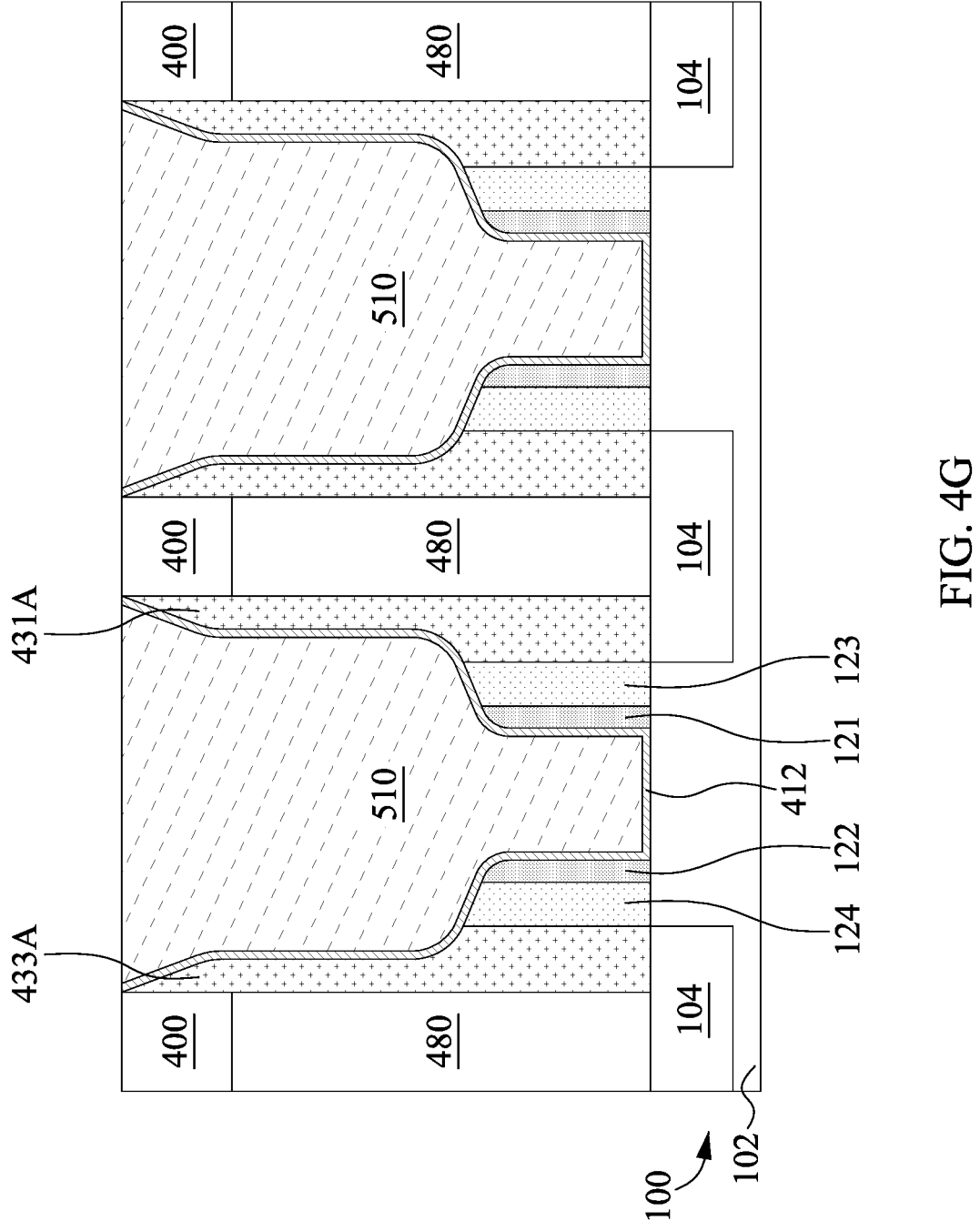

Referring to FIG. 4G, a gate dielectric material 412 may be formed in the trenches 600A and over the remained portions 431A and 433A of the CESLs 431 and 433 and the spacers 121, 122, 123, and 124, a gate material may be filled in the trenches 600A and on the gate dielectric material 412, and a planarization such as a chemical mechanical planarization (CMP) process may be performed to remove excess portions of the gate material outside of the trenches 600A to form a gate layer 510.

Figure 4H:
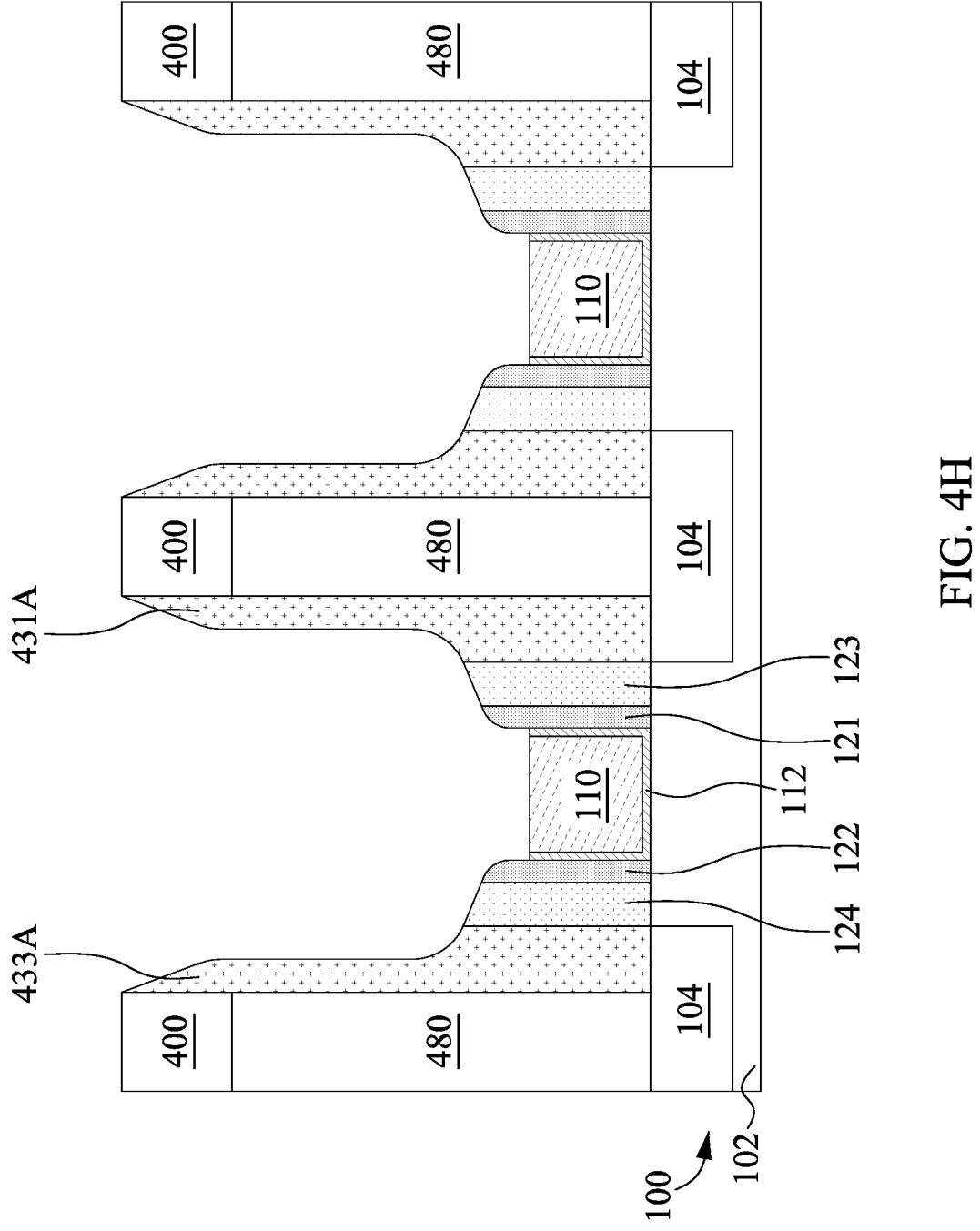

Referring to FIG. 4H, the gate dielectric material 412 and the gate layer 510 may be etched to create a substantially planar top surface which is recessed with respect to the top surfaces of the spacers 121, 122, 123, and 124 so as to form a gate electrode 110 and a gate dielectric 112. In some embodiments, the etching process can be an etch back process.

Figure 4I:
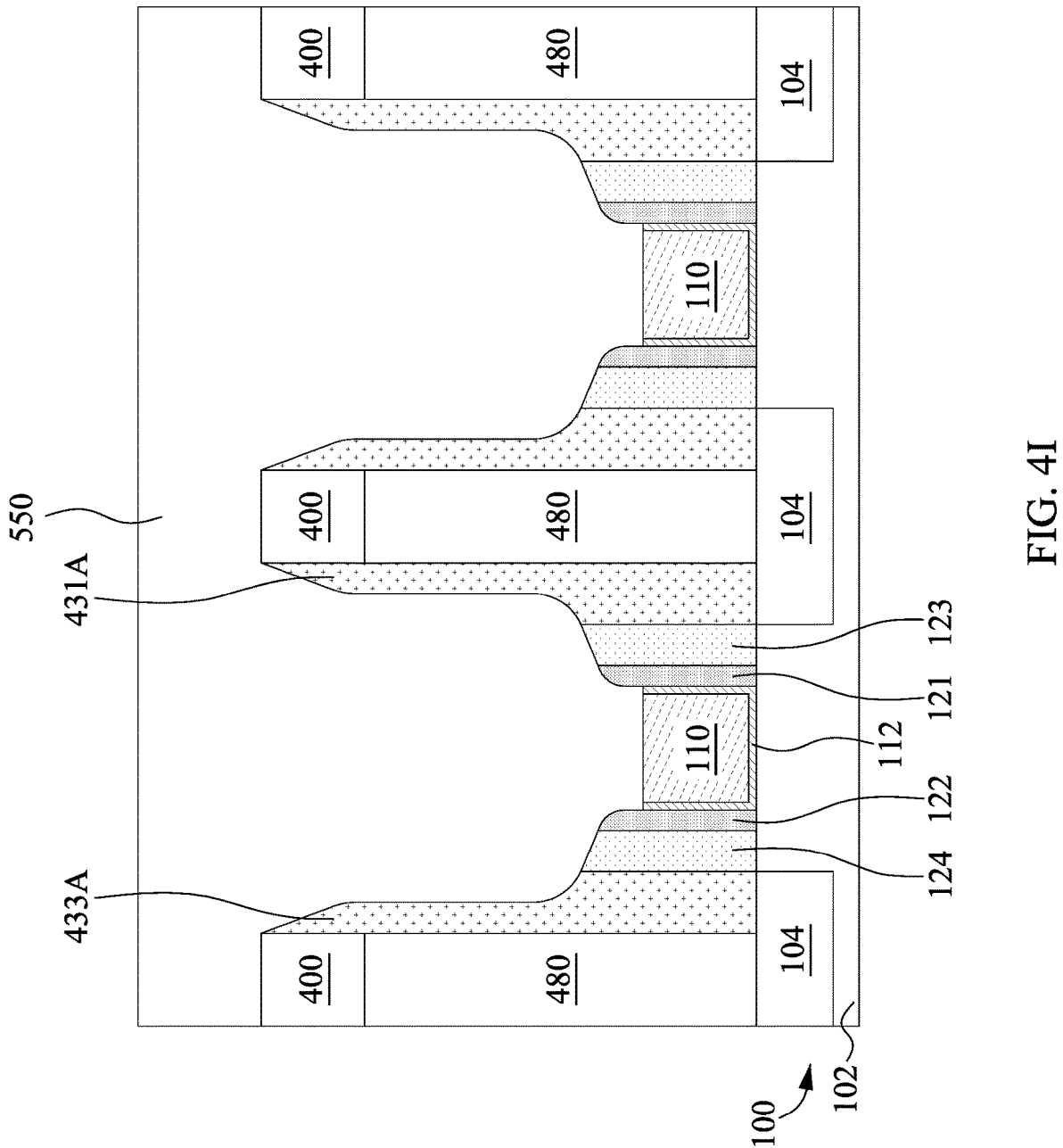

Referring to FIG. 4I, a dielectric layer 550 may be formed over the remained portions 431A and 433A of the CESLs 431 and 433, the spacers 121, 122, 123, and 124, and the gate electrode 110. The dielectric layer 550 may be deposited by a CVD process, a subatmospheric CVD (SACVD) process, a flowable CVD process, an ALD process, a PVD process, or other suitable process.

Figure 4J:
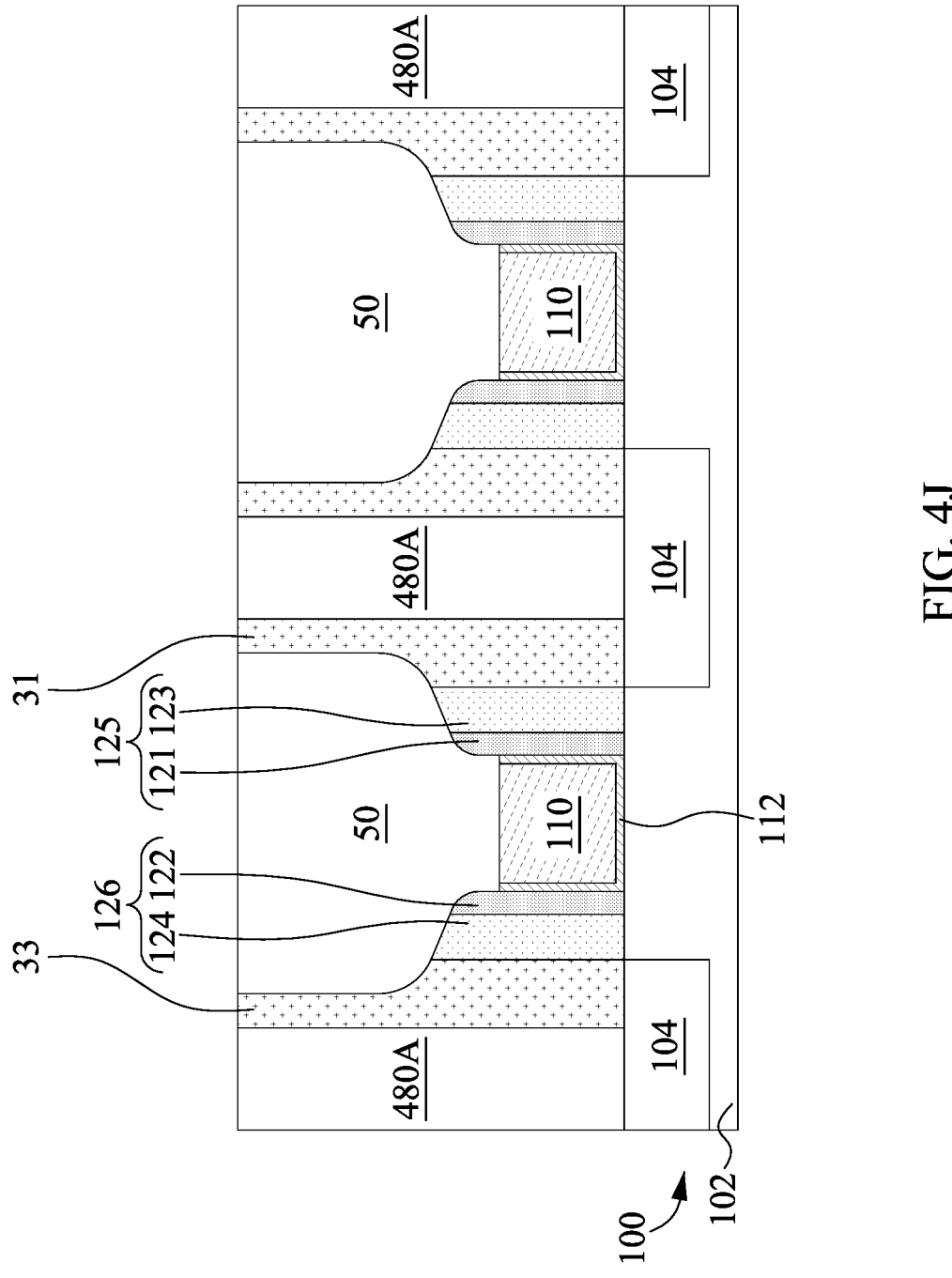

Referring to FIG. 4J, a planarization such as a chemical mechanical planarization (CMP) process may be performed to remove a portion of the dielectric layer 550, the hard mask 400, and portions of the remained portions 431A and 433A of the CESLs 431 and 433 to form a dielectric cap 50 and CESLS 31 and 33. In some embodiments, a portion of the ILD 480 is removed to form the ILD 480A.

Figure 4K:
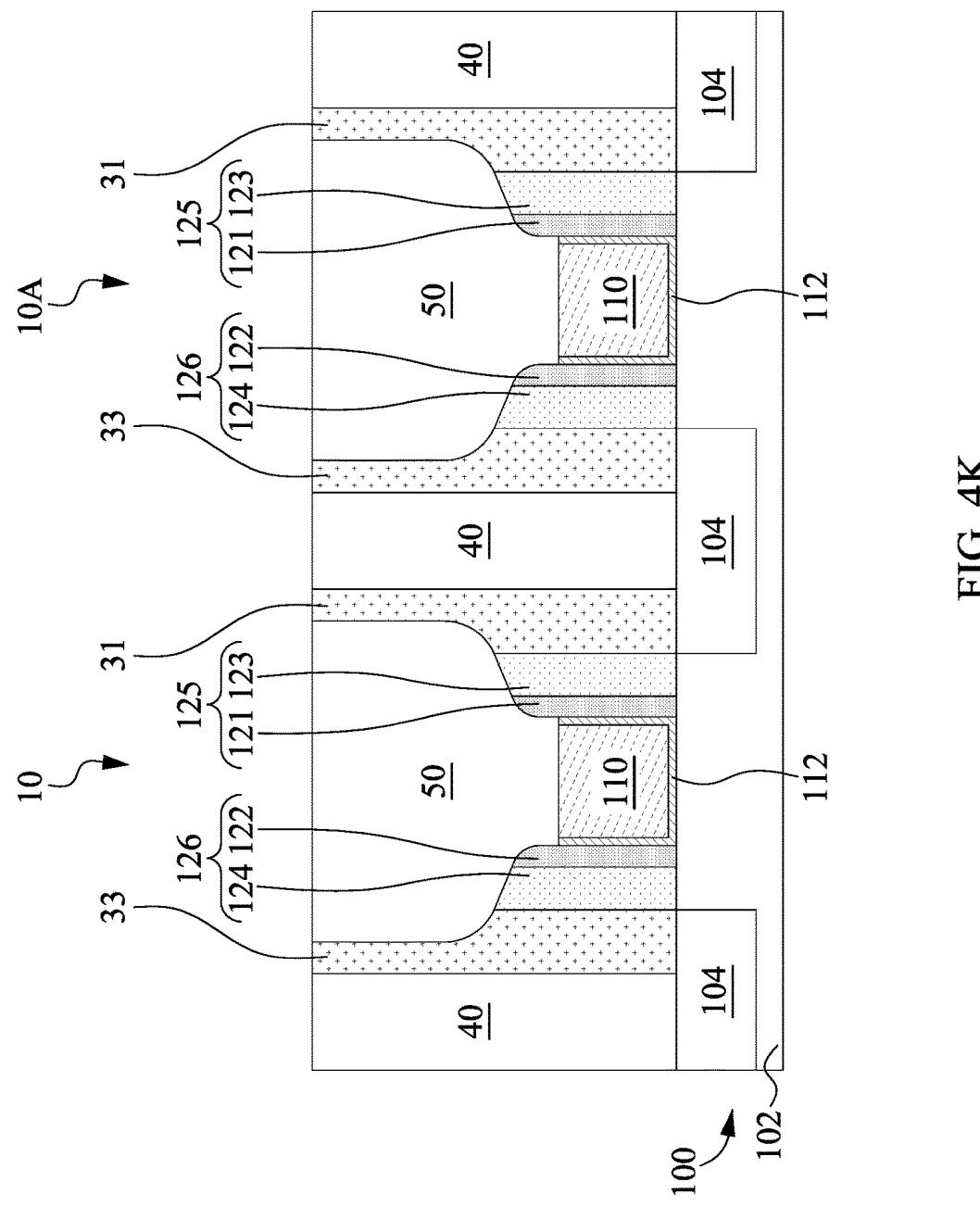

Referring to FIG. 4K, portions of the ILD 480 above the source/drain regions 104 may be removed to form trenches or through holes exposing top surfaces of the source/drain regions 104, and a conductive material may be filled in the trenches or through holes to form the contact structure 40. As such, the semiconductor structure 1 is formed.

In some comparative embodiments, semiconductor structures are manufactured with the gate electrode formed by filling a gate layer in a trench having consistent width, and the yield is about 63.3% to 68.4. In contrast, in some embodiments, the semiconductor structure 1 formed by the process illustrated in FIGS. 4A to 4K has a yield of about 89.9% to 94.9%.

In some cases where a gate layer having voids formed therein is filled in a trench defined by spacers, an etching process may be performed to etch back the gate layer to form a gate electrode, and the etchant may easily penetrate through the gate layer through the voids to reach the fin structure underneath. As such, the fin structure may be damaged by the etchant, and thus the yield is relatively low.

According to some embodiments of the present disclosure, with the design of the relatively low etching selectivity of the spacer layers 421 and 422 with respect to the spacer layers 423 and 424, trenches 600 and 600A having funnel-like profiles with relatively wide openings can be formed, and thus the processing window for filling the gate layer 510 in the trench 600A is enlarged, which is advantageous to forming the gate layer 510 in the trench 600A without having voids formed within the gate layer 510. Therefore, etchants in the etching process (i.e., the etch back process) for forming the gate electrode 110 can be prevented from reaching or damaging the fin structure 102 under the gate layer 510, and thus the yield of the semiconductor structure 1 can be increased.

Figure 5A:
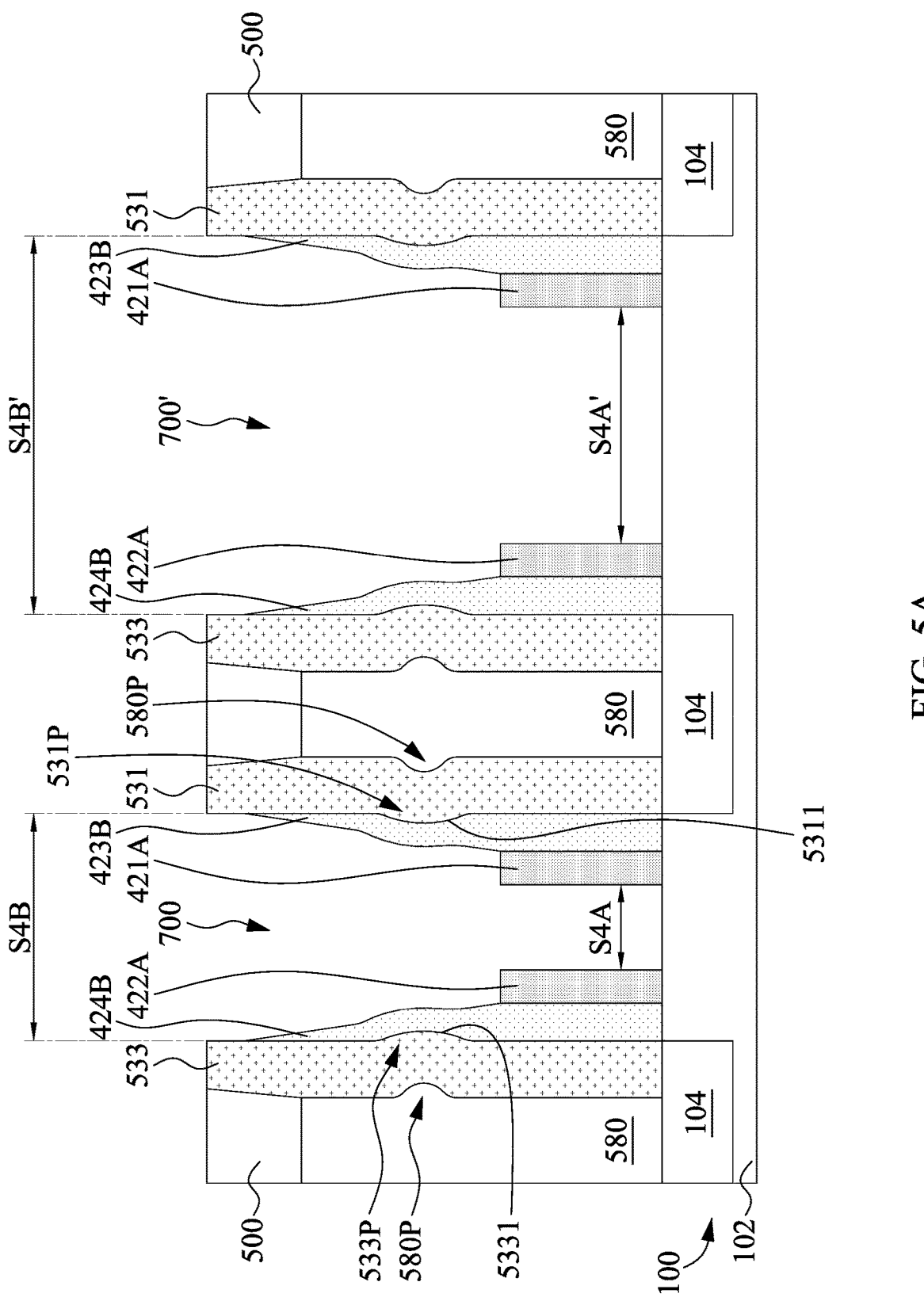
FIGS. 5A to 5B are cross-sectional views illustrating a semiconductor structure at various fabrication stages according to aspects of the present disclosure in one or more embodiments.
Figure 5B:
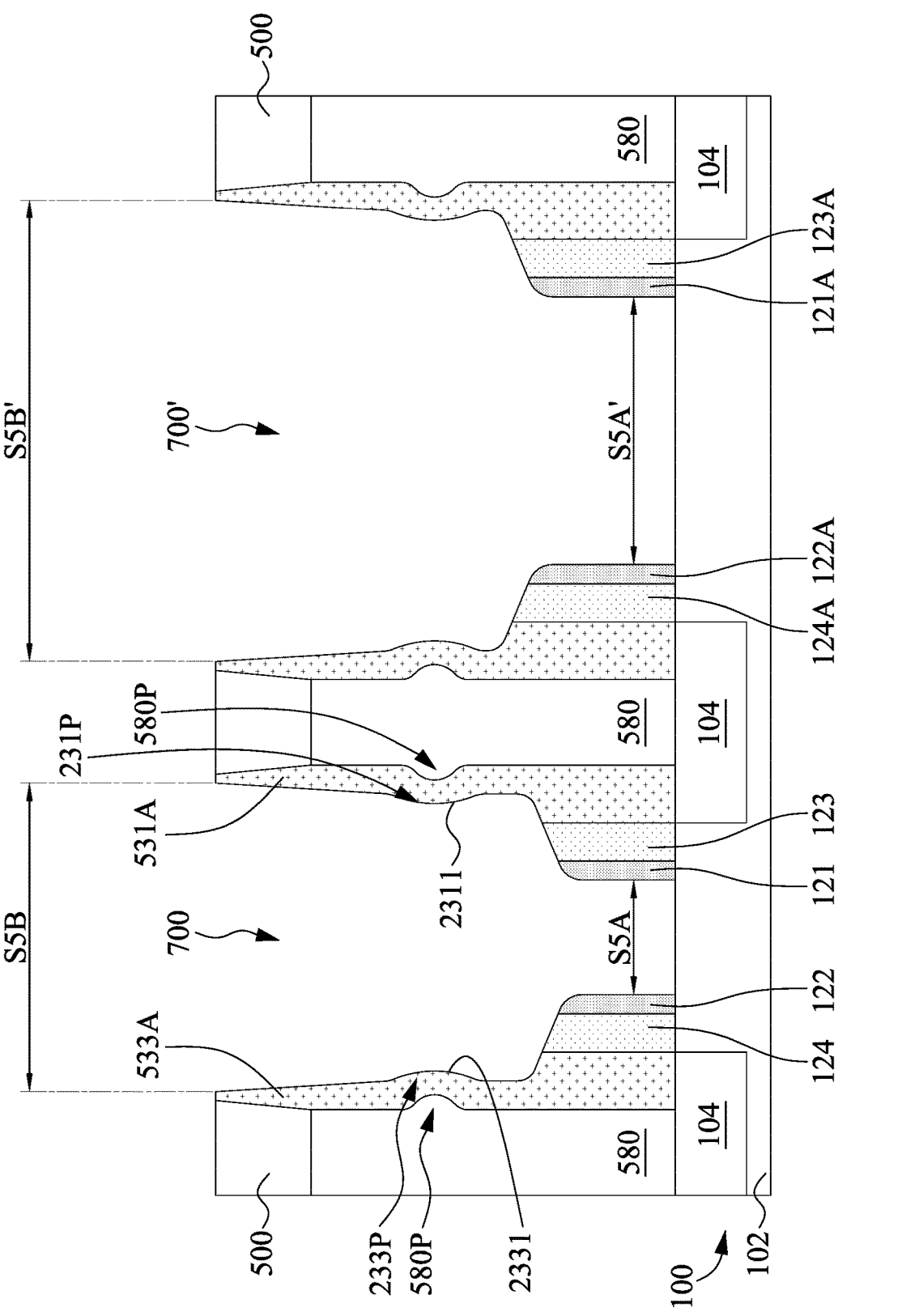

FIGS. 5A to 5B are cross-sectional views illustrating a semiconductor structure 3 at various fabrication stages according to aspects of the present disclosure in one or more embodiments.

Referring to FIG. 5A and FIGS. 4A-4D, one or more dummy gate layers having humps protruded from sidewalls thereof may be formed over a fin structure 102 of a semiconductor substrate 100, and spacer layers 421 and 422, spacer layers 423 and 424, and CESLS 531 and 533 may be conformally formed on sidewalls of the dummy gate layer. In some embodiments, an ILD layer 580 is conformally formed on the CESLs 531 and 533, and a hard mask 500 is formed on the ILD layer 580. In some embodiments, the spacer layers 421 and 422, the spacer layers 423 and 424, and the CESLS 531 and 533 having curved portions (e.g., humps and recesses). In some embodiments, the ILD 580 has humps 580 protruding towards the CESLS 531 and 533. In some embodiments, the CESLs 531 and 533 have humps 531P and 533P protruding towards the spacers. In some embodiments, two dummy gate layers having different lengths may be formed over the fin structure 102. In some embodiments, the distance between the spacer 421 and the spacers 422 corresponding to different dummy gate layers having different lengths are different.

Then, still referring to FIG. 5A and FIGS. 4A-4D, the dummy gate layer may be partially removed, the spacer layers 421 and 422 may be partially removed to form remained portions 421A and 422A covered by the remained dummy gate layer, the dummy gate layer may be then completely removed, and an etching process may be performed to partially remove the spacer layers 423 and 424 to form remained portions 423B and 424B. In some embodiments, an etching selectivity of the spacer layers 421 and 422 with respect to the spacer layers 423 and 424 of the etching process is less than about 2. In some embodiments, the etching selectivity of the spacer layers 421 and 422 with respect to the spacer layers 423 and 424 of the etching process is less than about 1.8, about 1.6, about 1.4, about 1.2, or about 1.1. In some embodiments, with the relatively low etching selectivity, the as-formed remained portions 423B and 424B are etched and thus having humps that are smoother than the original humps of the spacers 423 and 424.

In some embodiments, the remained portions 423B and 424B of the spacer layers 423 and 424 taper away from the fin structure 102 to define trenches 700 and 700' each having a size increasing toward a direction away from the fin structure 102. For example, the trench 700 may have a bottom with a size S4A and an opening with a size S4B greater than the size S4A. For example, the trench 700' may have a bottom with a size S4A' and an opening with a size S4B' greater than the size S4A'. In some embodiments, the trenches 700 and 700' have a funnel-like profile. In some embodiments, the exposed portions of the sidewalls of the CESLs 531 and 533 define the openings of the trench 700 and the trench 700'.

Referring to FIG. 5B and FIGS. 4E-4F, an oxidation process may be performed on the remained portions 421A and 422A of the spacer layers 421 and 422 and portions of the CESLs 531 and 533 after completely removing the dummy gate layers. In some embodiments, the oxidation process oxidizes a region of the remained portions 421A and 422A of the spacer layers 421 and 422, the remained portions 423B and 424B of the spacer layers 423 and 424, and portions of the CESLs 531 and 533 adjacent to their surfaces that are exposed to the trenches 700 and 700'.

Still referring to FIG. 5B and FIGS. 4E-4F, in some embodiments, a portion of the remained portions 423B and 424B of the spacer layers 423 and 424 exposed by the remained portions 421A and 422A of the spacer layers 421 and 422 may be removed to form a pair of spacers 123 and 124. In some embodiments, the CESLs 531 and 533 are partially removed to form remained portions 531A and 533A of the CESLs 531 and 533 that taper away from the fin structure 102 to define trenches 700A and 700A' having a size increasing toward a direction away from the fin structure 102. For example, the trench 700A may have a bottom with a size S5A and an opening with a size S5B greater than the size S5A. For example, the trench 700A' may have a bottom with a size S5A' and an opening with a size S5B' greater than the size S5A'. In some embodiments, the trenches 700A and 700A' have a funnel-like profile. In some embodiments, the size S5B of the opening of the trench 700A is greater than the size S4B of the opening of the trench 700. In some embodiments, the size S5B' of the opening of the trench 700A' is greater than the size S4B' of the opening of the trench 700'.

Still referring to FIG. 5B, in some embodiments, due to the difference in etching loadings on the spacers in the trenches 700 and 700' which having different lengths, the as-formed spacers in the trench 700' and the as-formed spacers in the trench 700 have different heights. In some embodiments, with the relatively low etching selectivity that make the remained portions 423B and 424B have humps that are smoother than the original humps of the spacers 423 and 424, and the as-formed remained portions 531A and 533A of the CESLs 531 and 533 also have humps 231P and 231P that are smoother than the original humps of the CESLs 531 and 533. For example, the original humps of the CESLs 531 and 533 may be conformal to the humps 580P. In some embodiments, the humps 231P and 233P are smoother than the humps 580P. In some embodiments, the humps being smoother refers to humps having reduced thicknesses, having greater curvatures, and/or having greater hump angles (refer to FIGS. 2 and 3 for definition).

Next, operation similar to those illustrated in FIGS. 4G-4K may be performed to form a gate dielectric 112, a gate electrode 110, a dielectric cap 50, and contact structure 40. As such, the semiconductor structure illustrated in FIG. 3 is formed.

According to some embodiments of the present disclosure, with the design of the relatively low etching selectivity of the spacer layers 421 and 422 with respect to the spacer layers 423 and 424, trenches 700 and 700A having funnel-like profiles with relatively wide openings can be formed, and also smoother shape in the middle section of the trench 700A can be formed (e.g., the smoother humps), and thus it is advantageous to forming the gate layer 510 in the trench 700A without having voids formed within the gate layer 510. Therefore, etchants in the etching process (i.e., the etch back process) for forming the gate electrode 110 can be prevented from reaching or damaging the fin structure 102 under the gate layer 510, and thus the yield of the semiconductor structure 3 can be increased.

Some embodiments of the present disclosure provide a semiconductor structure. The semiconductor structure includes a semiconductor substrate, a gate electrode, a first spacer, and a first contact etch stop layer (CESL). The semiconductor substrate includes a fin structure. The gate electrode is over the fin structure. The first spacer is over the fin structure and on a lateral side of the gate electrode, wherein a top surface of the first spacer is inclined towards the gate electrode. The first CESL is over the fin structure and contacting the first spacer, wherein an angle between the top surface of the first spacer and a sidewall of the first CESL is less than about 140°.

Some embodiments of the present disclosure provide a semiconductor structure. The semiconductor structure includes a semiconductor substrate, a first gate structure, and a second gate structure. The semiconductor substrate includes a fin structure. The first gate structure is over the fin structure. The first gate structure includes a first gate electrode and a first spacer structure having an inclined top surface. The second gate structure is over the fin structure. The second gate structure includes a second gate electrode and a second spacer structure having an inclined top surface. A channel length of the first gate structure is greater than a channel length of the second gate structure, and a height of the first spacer structure is greater than a height of the second spacer structure.

Some embodiments of the present disclosure provide a method for forming a semiconductor structure. The method includes following operations: forming a dummy gate layer over a fin structure of a semiconductor substrate; forming a pair of first spacer layers on opposite lateral sides of the dummy gate layer; forming a pair of second spacer layers on the first spacer layers; partially removing the dummy gate layer to expose a portion of the first spacer layers; performing an etching process to remove the portion of the first spacer layers exposed by the dummy gate layer and a portion of the second spacer layers, wherein an etching selectivity of the first spacer layers with respect to the second spacer layers of the etching process is less than about 2; completely removing the dummy gate layer to expose remained portions of the first spacer layers; and forming a gate electrode between the remained portions of the first spacer layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate comprising a fin structure;
   a first gate electrode over the fin structure;
   a first spacer over the fin structure and on a lateral side of the first gate electrode, wherein a top surface of the first spacer is inclined towards the first gate electrode;
   a first contact etch stop layer (CESL) over the fin structure, wherein the first CESL comprises a bulk portion contacting the first spacer and a wavy portion higher than the first spacer, the wavy portion is thinner than the bulk portion, and an angle between the top surface of the first spacer and a curved sidewall of the first CESL is less than about 140°; and
   a second gate electrode over the fin structure, wherein a length of the first gate electrode is greater than a length of the second gate electrode.

2. The semiconductor structure of claim 1, further comprising:
   a second spacer over the fin structure and on a lateral side of the first gate electrode opposite to the first spacer, wherein a top surface of the second spacer is inclined towards the first gate electrode; and
   a second CESL over the fin structure and contacting the second spacer, wherein the second CESL has a stepped surface substantially aligned to the top surface of the second spacer and a top surface at an elevation higher than an elevation of the stepped surface of the second CESL.

3. The semiconductor structure of claim 1, further comprising:
   a second spacer over the fin structure and on a lateral side of the first gate electrode opposite to the first spacer;
   a second CESL over the fin structure and on a side the second spacer opposite to the first gate electrode; and
   a contact structure over the fin structure and contacting the second CESL, wherein an interface between the contact structure and the second CESL comprises a first curved portion.

4. The semiconductor structure of claim 3, further comprising a dielectric cap on the first gate electrode and contacting the second CESL, wherein an interface between the dielectric cap and the second CESL comprises a second curved portion having a curvature greater than a curvature of the first curve portion.

5. The semiconductor structure of claim 1, wherein the first spacer comprises a first sub-spacer proximal to the first gate electrode and a second sub-spacer distal from the first gate electrode, and a thickness of the first sub-spacer is less than a thickness of the second sub-spacer.

6. The semiconductor structure of claim 1, wherein a top surface of the bulk portion of the first CESL is substantially aligned to the top surface of the first spacer, and a top surface of the wavy portion of the first CESL is at an elevation higher than an elevation of the top surface of the bulk portion of the first CESL.

7. The semiconductor structure of claim 1, wherein a sidewall of the first CESL is substantially straight, and a topmost surface of the first CESL is substantially planar.

8. A semiconductor structure, comprising:
a semiconductor substrate comprising a fin structure;
a first gate structure over the fin structure, the first gate structure comprising a first gate electrode and a first spacer structure having an inclined top surface;
a second gate structure over the fin structure, the second gate structure comprising a second gate electrode and a second spacer structure having an inclined top surface, wherein a channel length of the first gate structure is greater than a channel length of the second gate structure, and a height of the first spacer structure is greater than a height of the second spacer structure;
a dielectric cap covering a top surface of the first gate electrode and a curved surface of the first spacer structure and comprising a protrusion extending beyond the curved surface of the first spacer structure; and
a CESL comprising a bulk portion contacting the first spacer structure and a wavy portion higher than the first spacer structure, wherein the wavy portion is thinner than the bulk portion.

9. The semiconductor structure of claim 8, wherein a ratio of the channel length of the first gate structure to the channel length of the second gate structure is greater than about 5, and a difference between the height of the first spacer structure and the height of the second spacer structure is from about 5 nm to about 15 nm.

10. The semiconductor structure of claim 8, wherein a ratio of the channel length of the first gate structure to the channel length of the second gate structure is greater than about 7, and a ratio of a difference between the height of the first spacer structure and the height of the second spacer structure to the channel length of the first gate structure is from about 0.05 to about 0.15.

11. The semiconductor structure of claim 8, wherein the first spacer structure comprises a first spacer and a second spacer on opposite lateral sides of the first gate electrode, and top surfaces of the first spacer and the second spacer are inclined towards the first gate electrode.

12. The semiconductor structure of claim 8,
wherein the CESL comprises a first hump protruding towards the dielectric cap.

13. The semiconductor structure of claim 12, further comprising a contact structure contacting the CESL, wherein the contact structure comprises a second hump protruding towards the CESL, and a thickness of the first hump is less than a thickness of the second hump.

14. A semiconductor structure, comprising:
a semiconductor substrate comprising a fin structure;
a first gate structure over the fin structure, the first gate structure comprising a first gate electrode and a first spacer structure having an inclined top surface;
a second gate structure over the fin structure, the second gate structure comprising a second gate electrode and a second spacer structure having an inclined top surface, wherein a channel length of the first gate structure is greater than a channel length of the second gate structure; and
a first contact etch stop layer (CESL) comprising a bulk portion contacting the first spacer structure and a wavy portion higher than the first spacer structure, wherein the wavy portion is thinner than the bulk portion and comprises curved surfaces that bend in different directions.

15. The semiconductor structure of claim 14, further comprising a second CESL contacting the second spacer structure.

16. The semiconductor structure of claim 15, further comprising a first dielectric cap on the first gate electrode and a second dielectric cap on the second gate electrode, wherein a width of the first dielectric cap is greater than a width of the second dielectric cap.

17. The semiconductor structure of claim 15, further comprising a contact structure between the first gate electrode and the second gate electrode and contacting the first CESL and the second CESL.

18. The semiconductor structure of claim 17, wherein the contact structure comprises a first hump protruding into the first CESL and a second hump protruding into the second CESL.

19. The semiconductor structure of claim 17, wherein the inclined top surface of the first spacer structure and the inclined top surface of the second spacer structure are inclined away from the contact structure.

20. The semiconductor structure of claim 14, wherein the first spacer structure comprises a first sub-spacer proximal to the first gate electrode and a second sub-spacer proximal to the second gate electrode, and a thickness of the first sub-spacer is less than a thickness of the second sub-spacer.

* * * * *